(12) United States Patent
Nishitani et al.

(10) Patent No.: US 6,414,280 B1
(45) Date of Patent: Jul. 2, 2002

(54) HEAT TREATMENT METHOD AND HEAT TREATMENT APPARATUS

(75) Inventors: Eisuke Nishitani; Katsuhisa Kasanami; Naoko Matsuyama; Shinya Sasaki, all of Tokyo (JP)

(73) Assignee: Kokusai Electric Co., Ltd., Tokyo (JP)

( * ) Notice: Subject to any disclaimer, the term of this patent is extended or adjusted under 35 U.S.C. 154(b) by 0 days.

(21) Appl. No.: 09/539,216

(22) Filed: Mar. 30, 2000

(30) Foreign Application Priority Data

Mar. 31, 1999 (JP) .......................................... 11-093955

(51) Int. Cl.[7] .............................................. F27D 11/00
(52) U.S. Cl. ........................ 219/411; 219/390; 219/405; 118/724; 118/725; 392/416
(58) Field of Search ................................ 219/390, 405, 219/411; 118/724, 725, 50.1; 392/416, 418

(56) References Cited

U.S. PATENT DOCUMENTS

| | | | | |
|---|---|---|---|---|
| 5,057,668 A | * | 10/1991 | Gisdakis et al. ............ | 219/390 |
| 5,332,883 A | * | 7/1994 | Higashira ................... | 219/492 |
| 5,960,159 A | * | 9/1999 | Ikeda et al. ................. | 392/418 |
| 6,023,038 A | * | 2/2000 | van Gogh .............. | 219/121.43 |

* cited by examiner

*Primary Examiner*—Teresa Walberg
*Assistant Examiner*—Shawntina T. Fuqua
(74) *Attorney, Agent, or Firm*—Oliff & Berridge, PLC

(57) ABSTRACT

Uniformity of temperature is established within a wafer, and a higher throughput is achieved while the wafer heating time is dramatically reduced by combining lamp heating with hot-wall heating. Lamps 10 are provided outside the furnace body 3 of a hot-wall CVD apparatus. The hot-wall reactor furnace body 3 is preheated to a prescribed temperature. Wafers W are loaded into the furnace body 3, and these wafers W are rapidly heated immediately thereafter to the desired temperature by light emitted by the lamps 10. The lamps 10 are switched off following heating, and the wafer temperature is allowed to reach a uniform state as a result of heat diffusion in the wafers in the hot-wall reactor furnace body 3. It is also possible to adopt an arrangement in which preheating commensurate with the cooling occurring during the transport period is performed before the wafers W are loaded into the furnace body 3, the wafers W are then loaded into the reactor furnace body 3, and the wafer temperature is allowed to achieve a uniform state.

16 Claims, 20 Drawing Sheets

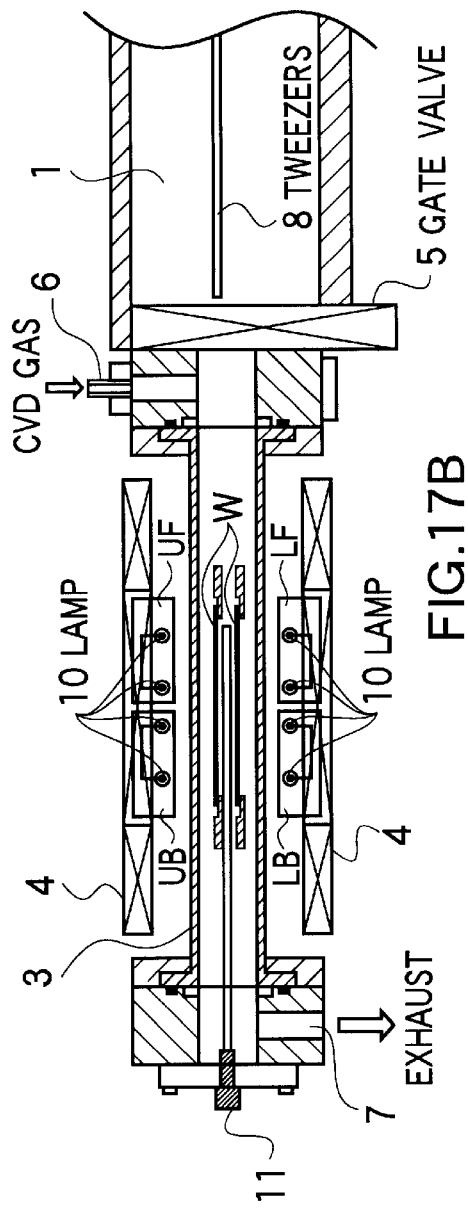
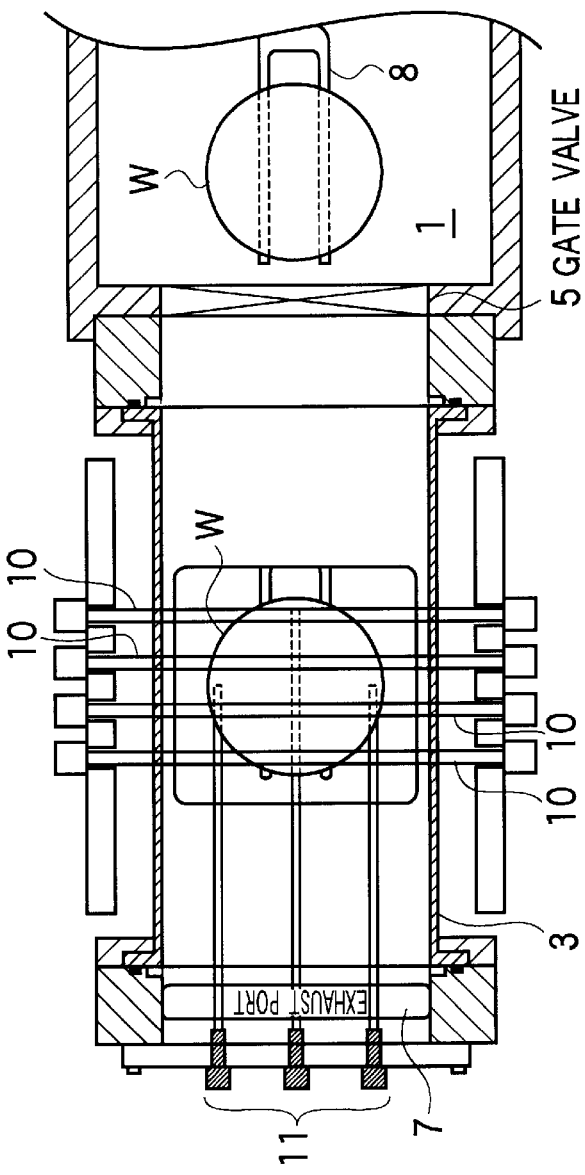

HEAT TREATMENT METHOD AND HEAT TREATMENT APPARATUS

BACKGROUND OF THE INVENTION

1. Field of the Invention

The present invention relates to a heat treatment method and a heat treatment apparatus for substrate heating, and more particularly to a heat treatment method and a heat treatment apparatus that allow a substrate to be heated to the desired temperature at a high rate and with good uniformity.

2. Description of the Related Art

As wafers have increased in diameter due to the need to achieve higher semiconductor integration and lower manufacturing costs, it has become difficult to form films with high precision across the surfaces of all the wafers of a batch inside a conventional batch-type vertical CVD apparatus. In view of this, single or dual substrate processing CVD apparatus in which each wafer is individually treated are being mostly used at the moment. A single or dual substrate processing CVD apparatus may be a cold-wall type or a hot-wall type.

(1) Cold-Wall Type

In a cold-wall apparatus, a wafer placed in a cooled reactor furnace body is directly heated by a lamp, or the wafer is heated after being placed on a susceptor heated by a heater, a lamp, or the like, and a film is deposited by feed a starting material gas. This type of apparatus differs from the batch type in that fluctuations among wafers can be reduced because the film can be deposited under the same heating conditions each time, but the wafers must be rotated in order to obtain a uniform film thickness distribution across the water surface, or various measures must be taken in order to create uniform conditions in which gas is fed above the wafers through a shower plate. Another approach is to render the wafer temperature uniform by adjusting the shape or arrangement of heating lamps, as described in Japanese Unexamined Patent Application (Kokai) 4-255214.

(2) Hot-wall Type

In a hot-wall apparatus, on the other hand, it is possible to dispense with complicated means for creating uniformity such as those found in cold-wall CVD apparatus, and the wafer temperature can be readily rendered uniform in the manner disclosed, for example, in Japanese Unexamined Patent Application 7-94419. FIG. 10 is a schematic cross section of such a hot-wall CVD apparatus. A reactor furnace body 3 itself is heated by resistance heater 4 disposed outside the reactor furnace body 3, and wafers W inside the reactor furnace body 3 are heated. A wafer W supported by tweezers 8 and transported from a transfer chamber 1 into the reactor furnace body 3 through a gate valve 5 is heated at a fairly high rate in the initial period of heating because or the temperature difference (400 to 700° C.) with the hot-wall system, but because the heat-up rate is proportional to the fourth power of the temperature difference, the heat-up rate decreases as the wafer temperature approaches the temperature of the hot-wall system, and ultimately a period or 5 minutes or greater is required for preheating, as shown in FIG. 11. By contrast, lamp heating markedly reduces the preheating time without appreciably lowering the heat-up rate due to the fact that because the filament temperature is high (2500 to 3000 K), the difference in temperature between the water and the filament is about 2000° C. even as the wafer approaches the desired temperature (400 to 700° C.).

As referred to herein, "preheating time" is the time elapsed between the moment a wafer W has been transferred to the reactor furnace body 3 and the moment the wafer W has reached the desired temperature and the desired uniformity has been achieved. The aforementioned hot-wall system is a system heated by a resistance heater 4 and composed of the reactor furnace body 3 itself and the atmosphere and objects inside the reactor furnace body 3.

A distinctive feature of the aforementioned hot-wall CVD apparatus is that because the wafer W and the interior walls of the reactor furnace body 3 are in a state of thermal equilibrium in which the temperatures of the two are equal to each other, the wafer temperature can be kept constant irrespective of the film type, providing excellent temperature uniformity and temperature stability. Another distinctive feature is that an additional gas introduction port (not shown) and an additional gas exhaust port (not shown) are provided at positions facing a CVD gas introduction port 6 connected to a flange 13 and an exhaust port 7 connected to a flange 14 across the wafers W, and a highly uniform film thickness is achieved by switching these ports during film formation and reversing the direction of gas flow.

Hot-wall CVD apparatus are disadvantageous, however, in that their throughput is low because the temperature of the wafers W is close to room temperature, and considerable preheating time which is about 5 minutes or longer (see FIG. 11) elapses between the moment the wafers are introduced into the reactor furnace body 3 and the moment the desired temperature is reached, resulting in an extended overall treatment time (tact time), including the film forming time.

In addition, this phenomenon becomes more pronounced with lower heating temperatures (furnace body temperatures). This occurs for the following reasons.

The lower the temperature (under about 500° C.) of the reactor furnace body 3, the lower the spectral radiant intensity (radiation intensity) and the farther the shift of the blackbody radiation wavelength distribution (radiation wavelength distribution) toward longer wavelengths, as shown in FIG. 12. A silicon wafer, on the other hand, has a very low absorption coefficient at wavelengths longer than 1.2 $\mu$m, resulting in poor heating efficiency and minimal absorption of heat from the example, the absorption efficiency is 3% and 15% at a wafer temperature of 400° C. and 500° C., respectively. Consequently, the heating efficiency decreases with a reduction in the temperature of the reactor furnace body 3. This causes considerable time to be expended when wafers are heated in a hot-wall CVD apparatus.

In addition, the temperature of the furnace body itself decreases due to the introduction of cold wafers W into the reactor furnace body, and time is needed for this temperature to recover. A feed-forward control (FFC) technique and a rapid heating technique have been proposed as means aimed at addressing this problem.

(1) FFC Technique

As noted above, the hot-wall system, in addition to being disadvantageous in the sense that the wafer heat-up rate is slow, is also disadvantageous in the sense that the temperature of the system is lowered by the introduction of wafers into the system. FFC is a technique in which the second drawback is dealt with by presetting the temperature of the system somewhat higher in view of the reduction in the temperature of the reaction furnace body. According to FFC results, however, setting the system temperature (FFC set temperature) somewhat higher (in the absence of a cooling means, the temperature cannot be set high, and it is no more than several tens of degrees Centigrade) merely improves the preheating time somewhat, failing to produce a depreciable reduction, as shown in FIG. 14.

(2) Rapid Heating Technique

As shown by the schematic cross section in FIG. 15, the technique envisages providing a rapid heater 9 in which the heat capacity of the heater for heating a reactor furnace body 3 is reduced to allow for rapid heating, and installing a forced air cooling mechanism (not shown) in which cooling air is forced through an excessively heated reactor furnace body 3 to allow the reactor furnace body 3 to be cooled at a high rate. According to this technique, the system temperature (FFC set temperature) during the loading of a wafer W can be set higher, making it possible to reduce the initial heating time needed to achieve the set temperature, as shown in FIG. 16. It is still impossible, however, to reduce the control period that needs to elapse before the set temperature can be stably sustained, so the resulting effect is small despite a reduction in the preheating time in comparison with conventional practice. Rather, this rapid heating technique aims at adequately recovering the temperature of the system to the FFC set temperature in the period between the end of film formation and the introduction of the next wafer. The hot-wall system was originally created to counter the effect of a disturbance such as the introduction of wafers W, and to maintain constant temperature in a sustained manner. Raising or lowering the temperature of the system as such in order to achieve a certain reduction in the heating time in the manner envisaged by the rapid heating technique is unsuitable because it negates the inherent advantages of the hot-wall system and complicates wafer temperature control.

As noted above, a distinctive feature of hot-wall reactor furnace body heating is that the wafer W and the furnace body 3 can be kept at the same temperature if the wafer W is introduced into the uniformly heated furnace body 3 and a thermal equilibrium is established, and that there is no need to take into account the effect of the different types of wafer W on the emissivity, absorption coefficient, and other thermal characteristics.

The above distinctive feature, however, is based on an ideal system in which the heat capacity of the hot-wall reactor furnace body 3 is infinitely large in relation to the heat capacity of the wafer W, whereas in reality a cold wafer W disrupts the system into which it is loaded, causing the temperature of the entire system to decrease.

SUMMARY OF THE INVENTION

The present invention provides a heat treatment method and a heat treatment apparatus that can be realized in a more ideal form. Specifically, an object of the prevent invention is to provide a heat treatment method and a heat treatment apparatus in which the advantages of commonly used hot-wall heat treatment apparatus can be preserved such that a uniform substrate temperature can be easily obtained, in which the unacceptably long substrate heating time of conventional hot-wall heat treatment apparatus can be reduced, and in which equipment throughput can be enhanced.

A distinctive feature of the present invention is the combined use of lamp (non-equilibrium) heating and hot-wall furnace body (equilibrium) heating. Hardly any disruption is caused in a system if a substrate is loaded into the system after the substrate W is brought in advance to the same average temperature as the system before the substrate is loaded into the system, or if the substrate is heated vary rapidly from the outside in such a way that the substrate is brought to the same temperature as the system before a substantial amount of heat is taken from the system immediately after substrata loading. The temperature of the substrate W can be subsequently rendered uniform in a comparatively short time by the inherent heat transfer capabilities of the substrate. In the process, lamp heating is used to heat the substrate to the same temperature as the system, and hot-wall furnace body heating is used to establish a uniform substrate temperature thereafter. To reiterate, a significant feature of lamp heating is that the heating time of a substrate can be readily reduced (the heating rate is proportional to the fourth power of the temperature difference and to the first power of radiant intensity) by creating a large difference in temperature between the light emitter (the filament inside a lamp) and the substrate (the object being heated), and raising the radiant intensity of the light emitter. With the products currently available on the market, lamp heating can yield a heat-up rate of about 100° C. per second. Consequently, the use of lamp heating can accelerate the process several tenfold, as compared with the five minutes needed to heat a substrate to 500° C. with hot walls.

Lamp heating is seriously disadvantageous, however, in that the continuously non-equilibrium character of such heating (in this case, the temperature of the substrate is determined by the balance between the heat quantity emitted by the radiation from the lamp and received by the substrate, and the heat quantity emitted by the radiation from the substrate) makes it very difficult to maintain a constant temperature, and that it is impossible to obtain a uniform temperature across a substrate surface unless the illuminance distribution of the substrate is controlled with high accuracy.

In view of this, the present invention is aimed at providing a heat treatment method and a heat treatment apparatus in which lamp (non-equilibrium) heating and hot-wall furnace body (equilibrium) heating are used together, substrates are rapidly heated (in this case, nonuniformly) by lamps at the start of heating under conditions in which the temperature distribution is largely ignored, and a uniform temperature is then established across the substrate surface by employing heat transfer in a thermally uniform system. Following is a description of the means employed to attain the above-described object of the present invention.

The invention of claim 1 resides in a heat treatment method wherein a hot-wall heat treatment apparatus in which the temperature inside a reactor furnace body is kept at a prescribed level with the aid of resistance heaters prior to substrate loading into the reactor furnace body is provided with lamps disposed outside the reactor furnace body and designed to heat substrates loaded into the reactor furnace body by light emission transmitted through the reactor furnace body, comprising a step in which the substrates are loaded into the reactor furnace body kept at the prescribed temperature, and the substrates are then directly heated to a desired temperature by the lamps provided outside the reactor furnace body under continued heating by the resistance heaters. The present invention allows high throughput and improved process productivity to be obtained because the heating time on be markedly reduced in comparison with the heating time based on the use of hot walls.

The invention of claim 2 resides in a heat treatment method as defined in claim 1, this heat treatment method comprising a step in which the substrates are heated to substantially the desired temperature by the lamps, the lamps are then switched off, azo the substrates are kept for a prescribed time inside the reactor furnace body kept at the prescribed temperature by the resistance heaters before a reaction treatment is started. It is preferable to use a procedure in which the lamps are switched off once the average temperature of the substrates has been brought to substantially the desired temperature by lamp heating, the substrates are kept for a prescribed time in the hot-wall system after the lamps have been switched off, and a state in which the substrates themselves have achieved a uniform state through heat transfer is awaited. It is thus possible to overcome one of the drawbacks of lamp heating; namely, that a substrate can be rapidly heated but it is difficult to keep at a constant temperature with high accuracy and in a controlled manner. The present invention allows the heating temperature to be controlled with higher accuracy than in the case of a heating temperature achieved with lamp heating.

The invention of claim 3 resides in a heat treatment method as defined in claim 1, this heat treatment method comprising presetting the temperature inside the reactor furnace body before the lamps are lighted to a level different from the a desired reaction temperature in such a way that the temperature inside the reactor furnace body coincides with the desired reaction temperature when the lamps are switched off after the substrates have been heated to substantially the desired temperature by the lamps. The temperature of the hot-well system in preset to a level somewhat higher or lower than the treatment temperature to compensate for variations in the hot-wall system, such as temperature reductions during substrate transport or the heating of the reactor furnace by the long-wavelength components of lamp light during lamp heating. Setting the temperature inside the reactor furnace body to a level different from the reaction temperature prior to lamp lighting makes it possible to keep the temperature inside the reactor furnace body at the desired reaction temperature when the lamps are switched off.

The invention of claim 4 resides in a heat treatment method as defined in claim 1, this heat treatment method comprising: measuring in advance the lamp output, lamp lighting time, and other lamp heating conditions needed for the substrate temperature to substantially achieve a prescribed level after the substrates (dummy substrates) have been loaded into the reactor furnace body and the lamps lighted; and heating the substrates(substrates for products) in the actual substrate treatment step under the lamp heating conditions obtained as a result of the measurements. An optimum heating condition suitable for rapid heating can be obtained because the optimum lamp output and lighting time are measured in advance by using the dummy substrates having substantially the same thermal characteristic as that of the substrates for products. The optimum lamp output and lighting time are lamp output and lighting time which needed to achieve a prescribed temperature when the dummy substrates are heated under substantially the same lamp heating conditions as those that are to be established during an actual substrate treatment.

The invention of claim 5 resides in a hot-wall heat treatment method comprising keeping the temperature inside a reactor furnace body at a prescribed level with the aid of resistance heaters prior to substrate loading into the reactor furnace body, this heat treatment method further comprising a stop in which the substrates are preheated in such a way that the substrate temperature prior to substrate loading into the reactor furnace body is higher than the prescribed temperature inside the reactor furnace body. This method comprises providing substrate preheater designed to preheat the substrates and disposed in a transfer chamber connected to the reactor furnace body, estimating the reduction in substrate temperature during the loading of the substrates from the transfer chamber into the reactor furnace body kept at the prescribed temperature, and preheating the substrates to an excess commensurate with the temperature reduction in such a way that the substrates are kept at the desired temperature immediately after being loaded into the reactor furnace body.

Although the present invention entails providing the transfer chamber with additional substrate preheater or requiring that the substrates be heated for a longer time before being loaded into the reactor furnace body, the fact that the substrates are preheated outside the reactor furnace body instead of inside the reactor furnace body makes it possible to reduce the thermal effect on the reactor furnace body and to utilize the hot-wall feature. In addition, the reactor furnace body does not need to be transparent, so the arrangement is not limited to apparatus for forming specific types of transparent films and can be applied to a heat treatment apparatus capable of handling any type of film.

The invention of claim 6 resides in a heat treatment method as defined in claim 5, this heat treatment method comprising: measuring the substrate cooling rate in advance and calculating on the basis thereof an appropriate excess temperature representing the difference between the prescribed temperature inside the reactor furnace body and the preheating temperature of the substrates; and preheating the substrates in the actual treatment step on the basis of the appropriate substrate preheating temperature determined based on the excess temperature calculated using the measurements. Calculating a more appropriate excess temperature allows the substrates to be preheated to the optimum temperature, making it possible to minimize the thermal effect inside the reactor furnace body brought about by the loading of the substrates into the reactor furnace body, and hence to further reduce the time needed to stabilize the substrate temperature after the substrates have been loaded into the reactor furnace body.

The invention of claim 7 resides in a heat treatment method as defined in claim 5, this heat treatment method comprising estimating the different reductions in temperature during transport due to the differences in the distance of two substrates between their respective preheating positions and the reactor furnace body when these substrates are simultaneously preheated and loaded into the reactor furnace body, and independently preheating each substrate under a respective set of desired preheating conditions. Because two substrates are independently preheated at the same time, it is possible to estimate the difference in transport time due to the difference between the distances over which the substrates are transported from their respective preheating positions to the reactor furnace body. In other words, the difference in the temperature reduction between the substrates can be estimated, and each substrate can be preheated under its own set of desirable heating conditions.

The invention of claim 8 resides in a hot-wall heat treatment apparatus for heating the interior of a reactor furnace body with the aid of resistance heaters provided outside the reactor furnace body, this heat treatment apparatus comprising: lamps provided outside the reactor furnace body and designed to heat substrates inside the reactor furnace body by light emission transmitted through the reactor furnace body; resistance heater controller that energizes the resistance heaters prior to substrate loading into the reactor furnace body, keeps the temperature inside the reactor furnace body at a prescribed level, and maintains this energized state after the substrate have been loaded into the reactor furnace body; and lamp controller that lights the lamps after the substrates have been loaded into the reactor furnace body, heats the substrates to a near-prescribed temperature, and switches off the lamps following heating. The reactor furnace should preferably be a single or dual substrate processing furnace made of quartz and designed to treat approximately one or two substrates at a time. The lamps should preferably be halogen lamps. The resistance heater control unit and lamp control unit may be configured separately or integrally.

Lamps and resistance heaters are provided outside the reactor furnace body, and lamp (non-equilibrium) heating and hot-wall (equilibrium) heating are used jointly. First, the reactor furnace body is kept at a prescribed temperature by resistance heating prior to substrate loading. Next, after the substrates have been loaded into the reactor furnace body, the substrates are rapidly heated by the lamps to a near-prescribed temperature, and the lamps are switched off. The substrate temperature is subsequently rendered uniform by utilizing the heat transfer of the substrate in the system where a uniform thermal state has been established through hot-wall heating. Because a uniform substrate temperature is established by keeping the reactor furnace body at a prescribed temperature, there in no need to maintain particularly high accuracy when controlling the distribution of illuminance across the substrates during lamp heating. The present invention yields a high-throughput heat treatment apparatus because the heating time is much shorter than when hot walls alone are used, and allows the heating temperature to be controlled with higher accuracy than when lamp heating alone is used.

The invention of claim 9 resides in a heat treatment apparatus as defined in claim 8, this heat treatment apparatus comprising performing a treatment while supporting the flat surfaces of the substrates substantially parallel to the direction of substrate transport inside the reactor furnace body. Because the substrates are supported inside the reactor furnace in such a way that the flat surfaces of the substrates are substantially parallel to the direction of substrate transport higher heating efficiency can be achieved through lamp heating and the substrates can be heated at a higher rate than when the substrates are supported such that their flat surfaces are perpendicular to the transport direction.

The invention of claim 10 resides in a heat treatment apparatus as defined in claim 9, this heat treatment apparatus comprising treating a single substrate or two substrates stacked in the vertical direction perpendicular to the flat surfaces of the substrates. A single or dual substrate processing heat treatment apparatus containing heating system capable of treating one or two substrates in which resistance heating and lamp heating are combined is thus adopted, making it possible to heat each substrate at a high rate and to heat-treat the entire substrates with high accuracy of the temperature and uniformity.

The invention of claim 11 is a heat treatment apparatus as defined in claim 9, this heat treatment apparatus comprising disposing the lamps opposite the flat surfaces of the substrates. Disposing the lamps opposite the flat surfaces of the substrates makes it easier for the light emitted from the lamps to effectively irradiate the flat surfaces of the substrates in comparison with an arrangement in which, for example, the lamps are disposed opposite the end faces of the substrates, it is therefore possible to heat the substrates at an even faster rate and to achieve even higher throughput.

The invention of claim 12 resides in a heat treatment apparatus as defined in claim 10 for treating two substrates, this heat treatment apparatus comprising an arrangement in which the lamps are provided at an upper position and a lower position, the flat surface of the upper substrate is directly heated by placing the upper lamps opposite the flat surface of the upper substrate, and the flat surface of the lower substrate is directly heated by placing the lower lamps opposite the flat surface of the lower substrate. Placing the upper lamps opposite the upper substrate, and the lower lamps opposite the lower substrate allows the upper substrate and lower substrate to be heated at a high rate by the upper lamps and lower lamps, respectively, making it possible to achieve an even greater increase in throughput.

In addition, adopting an arrangement in which the flat surface of the upper substrate is directly heated by the upper lamps, and the flat surface of the lower substrate is directly heated by the lower lamps makes it possible to heat the two substrates simultaneously and at a higher rate than when end faces of the substrates are heated. Furthermore, settings corresponding to different heating conditions can be selected for the upper lamps and lower lamps when the heating conditions of the upper substrate and lower substrate differ from each other. It is thus possible to provide a heating arrangement in which the temperatures of the upper substrate and lower substrate are rendered uniform.

The invention of claim 13 resides in a heat treatment apparatus as defined in claim 12, this heat treatment apparatus comprising substantially equalizing the distance between the upper lamps and the upper substrate with the distance between the lower lamps and the lower substrate. Substantially equalizing the distance between the upper lamps and the upper substrate with the distance between the lower lamps and the lower substrate facilitates uniform heating of the upper substrate and lower substrate and makes it possible to deposit uniform films on two substrates at the body time.

The invention of claim 14 resides in a heat treatment apparatus as defined in claim 8, this heat treatment apparatus comprising a plurality of the lamps arranged in the direction of substrate transport. Even when the heating conditions vary across the substrate surfaces, these substrate surfaces can be uniformly heated at a high rate because the settings for each lamp are selected in accordance with the heating conditions for this lamp.

The invention of claim 15 resides in a heat treatment apparatus as defined in claim 14, this heat treatment apparatus comprising using as the lamps rod-shaped lamps disposed perpendicular to the direction of substrate transport. It is important to provide an illuminance distribution that allows substrates to be uniformly heated by lamps. Strictly speaking, "uniform substrate heating" and "uniform illuminance distribution" do not necessarily have the same meaning, and an optimum illuminance distribution does exist. Examples of methods used to control the illuminance distribution include those in which a plurality of lamps are appropriately arranged, those in which the emission density inside a rod-shaped lamp is adjusted, and those in which reflecting surfaces are provided. The simplest method is to use rod-shaped lamps and to arrange a plurality of these lamps perpendicular to the direction of substrate transport but parallel to the flat surfaces of horizontally held substrates. The average substrate temperature can thus be rapidly raised, and the temperature distribution across the substrate rendered uniform. As a result, the substrate temperature can be rapidly and uniformly raised to the desired level.

The invention of claim 16 resides in a heat treatment apparatus as defined in claim 12, this heat treatment apparatus allowing lamp output to be independently controlled. Lamp output can be independently controlled, making it possible to compensate for a temperature reduction brought about, for example, by the escape of heat through the areas adjacent to the transport port during transport. In addition, the film thickness distribution across a substrate surface can be arbitrarily corrected, the film thickness within a substrate surface can be rendered more uniform, and a film with highly accurate thickness and uniformity can be deposited across the entire surface. When different heating conditions are used for upper and lower substrates, the upper and lower lamps are controlled in accordance with these different heating conditions, making it possible to heat the upper and lower substrates in a uniform manner.

The invention of claim 17 resides in a heat treatment apparatus as defined in claim 8, this heat treatment apparatus comprising presetting the temperature inside the reactor furnace body before the lamps are lighted to a level different from a desired reaction temperature in such a way that the temperature inside the reactor furnace body coincides with the desired reaction temperature when the lamps are switched off. The temperature of the hot-wall system is preset to a level somewhat higher or lower than the treatment temperature to compensate for variations in the hot-wall system, such as temperature reductions during substrate transport or the heating of the reactor furnace by the long-wavelength components of lamp light during lamp heating.

The invention of claim 18 resides in a heat treatment apparatus as defined in claim 8, this heat treatment apparatus comprising: providing the reactor furnace body with detachable temperature sensor that measures the temperature in the vicinity of the substrates inside the reactor furnace body; using the temperature sensor disposed inside the reactor furnace body to measure in advance the lamp output, lamp lighting time, and other lamp heating conditions needed for the substrate temperature to substantially achieve a prescribed level after the substrates (dummy substrates) have been loaded into the reactor furnace body and the lamps lighted; and beating the substrates(substrates for products) under the lamp heating conditions obtained through these measurements in an actual substrate treatment step devoid of the temperature sensor. An optimum heating condition suitable for rapid heating can be obtained because the optimum lamp output and lighting time are measured in advance by using the dummy substrates having substantially the saw thermal characteristic as that of the substrates for products. The optimum lamp output and lighting time an lamp output and lighting time which needed to achieve a prescribed temperature when the dummy substrates are heated under substantially the same lamp heating conditions as those that are to be established during an actual substrate treatment.

The invention of claim 19 resides in a hot-wall heat treatment apparatus for keeping the temperature inside a reactor furnace body at a prescribed level with the aid of resistance heaters prior to substrate loading into the reactor furnace body, this heat treatment apparatus comprising: substrate preheater designed to preheat the substrates and disposed in a transfer chamber connected to the reactor furnace body; and preheating controller that preheats the substrates in such a way that the substrate temperature is higher than the proscribed temperature inside the reactor furnace body in order to compensate for the reduction in the substrate temperature when the substrates are loaded from the transfer chamber into the reactor furnace body kept at the prescribed temperature. More specifically, the preheating controller serves to estimate the reduction in temperature brought about when substrates are loaded into a reactor furnace body kept at a proscribed temperature, and to preheat the substrates to a higher temperature commensurate with the reduction in temperature such that the substrates have the desired temperature immediately after being loaded into the reactor furnace body. Although the transfer chamber is provided with additional substrate preheater, or the substrates must be heated for a longer time before being loaded into the reactor furnace body, the fact that the substrates are preheated outside the reactor furnace body instead of inside the reactor furnace body sags it possible to reduce the thermal effect on the reactor furnace body and to utilize the hot-wall feature. In addition, the arrangement is not limited to applications involving heat treatment apparatus for handling film through which lamp light transmits, and can be applied to a heat treatment apparatus capable of handling any type of file. Because the substrate preheater is provided in the transfer chamber, there is no need to provide special preheat chamber etc. Thus it is possible to miniaturizes the apparatus.

The invention of claim 20 resides in a heat treatment apparatus as defined in claim 19, this heat treatment apparatus comprising providing the transfer chamber with two preheating positions for allowing two substrates to be preheated at the same time; and two sets of substrate preheaters that allow the substrates disposed at the two preheating positions to be independently body preheated under the corresponding sets of desired heating conditions. Because two preheating positions and two sets of substrate preheaters are provided, and because two substrates are independently preheated at the same time, it is possible to estimate the difference in transport time due to the difference between the distances over which the substrates are transported from their respective preheating positions to the reactor furnace body. In other words, the difference in the temperature reduction between the substrates can be estimated, and each substrate can be preheated under its own set of desirable heating conditions.

The invention of claim 21 resides in a heat treatment apparatus as defined in claim 19, this heat treatment apparatus comprising providing the transfer chamber with temperature sensors for measuring the substrate temperature; heating the substrates in the transfer chamber with the aid of the substrate preheater; and computing the cooling rate of the substrates by measuring variations in the substrate temperature with the aid of the temperature sensors disposed in the transfer chamber, calculating on the basis thereof an appropriate excess temperature representing the difference between the prescribed temperature inside the reactor furnace body and the preheating temperature of the substrates, and establishing an appropriate substrate preheating temperature inside the transfer chamber. Calculating a more appropriate excess temperature allows the substrates to be preheated to the optimum temperature, making it possible to minimize the thermal effect inside the reactor furnace body brought about by the loading of the substrates into the reactor furnace body, and hence to further reduce the time needed to stabilize the substrate temperature after the substrates have been loaded into the reactor furnace body.

The invention of claim 22 resides in a heat treatment apparatus as defined in claim 19, this heat treatment apparatus comprising using lamps as the substrate preheater in the transfer chamber. The substrate preheater of the transfer chamber my be resistance heaters, but lamps are preferred from the standpoint of rapid heating.

The invention of claim 23 resides in a hot-wall heat treatment apparatus for heating the interior of a reactor furnace body with the aid of resistance heaters provided outside the reactor furnace body, this heat treatment apparatus comprising: lamps provided outside the reactor furnace body and designed to heat substrates inside the reactor furnace body by light emission transmitted through the reactor furnace body; resistance heater control means for energizing the resistance heaters prior to substrate loading into the reactor furnace body, keeping the temperature inside the reactor furnace body at a prescribed level, and maintaining this energized state after the substrate have been loaded into the reactor furnace body; and lamp control means for lighting the lamps after the substrates have been loaded into the reactor furnace body, heating the substrates to a near-prescribed temperature, and switching off the lamps following heating. The reactor furnace should preferably be a single or dual substrate processing furnace made of quartz and designed to treat approximately one or two substrates at a time. The lamps should preferably be halogen lamps. The resistance heater control unit and lamp control unit may be configured separately or integrally.

Lamps and resistance heaters are provided outside the reactor furnace body, and lamp (non-equilibrium) heating and hot-wall (equilibrium) heating are used jointly. First, the reactor furnace body is kept at a proscribed temperature by resistance heating prior to substrate loading. Next, after the substrates have been loaded into the reactor furnace body, the substrates are rapidly heated by the lamps to a near-prescribed temperature, and the lamps are switched off. The substrate temperature is subsequently rendered uniform by utilizing the heat transfer of the substrate in the system where a uniform thermal state has been established through hot-wall heating. Because a uniform substrate temperature is established by keeping the reactor furnace body at a prescribed temperature, there is no need to maintain particularly high accuracy when controlling the distribution of illuminance across the substrates during lamp heating. The present invention yields a high-throughput heat treatment apparatus because the heating time is much shorter than when hot wells alone are used, and allows the heating temperature to be controlled with higher accuracy than when lamp heating alone is used.

The invention of claim 24 resides in a hot-wall heat treatment apparatus for keeping the temperature inside a reactor furnace body at a prescribed level with the aid of resistance heaters prior to substrate loading into the reactor furnace body, this heat treatment apparatus comprising: substrate preheating means designed to preheat the substrates and disposed in a transfer chamber connected to the reactor furnace body; and preheating control means for preheating the substrates in such a way that the substrate temperature is higher than the prescribed temperature inside the reactor furnace body in order to compensate for the reduction in the substrate temperature when the substrates are loaded from the transfer chamber into the reactor furnace body kept at the prescribed temperature, more specifically, the preheating control means serves to estimate the reduction in temperature brought about when substrates are loaded into a reactor furnace body kept at a prescribed temperature, and to preheat the substrates to a higher temperature commensurate with the reduction in temperature such that the substrates have the desired temperature immediately after being loaded into the reactor furnace body. Although the transfer chamber is provided with additional substrate preheating means, or the substrates must be heated for a longer time before being loaded into the reactor furnace body, the fact that the substrates are preheated outside the reactor furnace body instead of inside the reactor furnace body makes it possible to reduce the thermal effect an the reactor furnace body and to utilize the hot-wall feature. In addition, the arrangement is not limited to application involving heat treatment apparatus for handling film through which lamp light transmits, and can be applied to a heat treatment apparatus capable of handling any type of film.

BRIEF DESCRIPTION OF THE DRAWINGS

FIG. 17A and FIG. 17B are schematic cross sections of a rapid-heating, hot-wall CVD apparatus and a wafer temperature measuring apparatus obtained by adopting an initial lamp heating technique according to an embodiment;

DESCRIPTION OF THE PREFERRED EMBODIMENTS

A rapid-heating, hot-wall CVD apparatus will now be described as an embodiment of the present invention. In this apparatus, lamp heating and hot-wall heating are combined, the substrate is heated by a lamp or the like at a high rate during initial heating, and uniformity of temperature is then established across the wafer surface by heat transfer based on hot-wall heating. Here, the process is implemented according to the following two embodiments.

(1) Method in which the substrate is heated directly by a lamp inside a quartz reactor furnace body (first embodiment)

The issue is whether light form the lamp is capable of adequately passing through the heated quartz reactor furnace body.

(2) Method is which the substrate is preheated before being loaded into the furnace body (second embodiment)

The issue is the reduction in substrate temperature prior to loading into the furnace body.

First Embodiment

Figure 1:
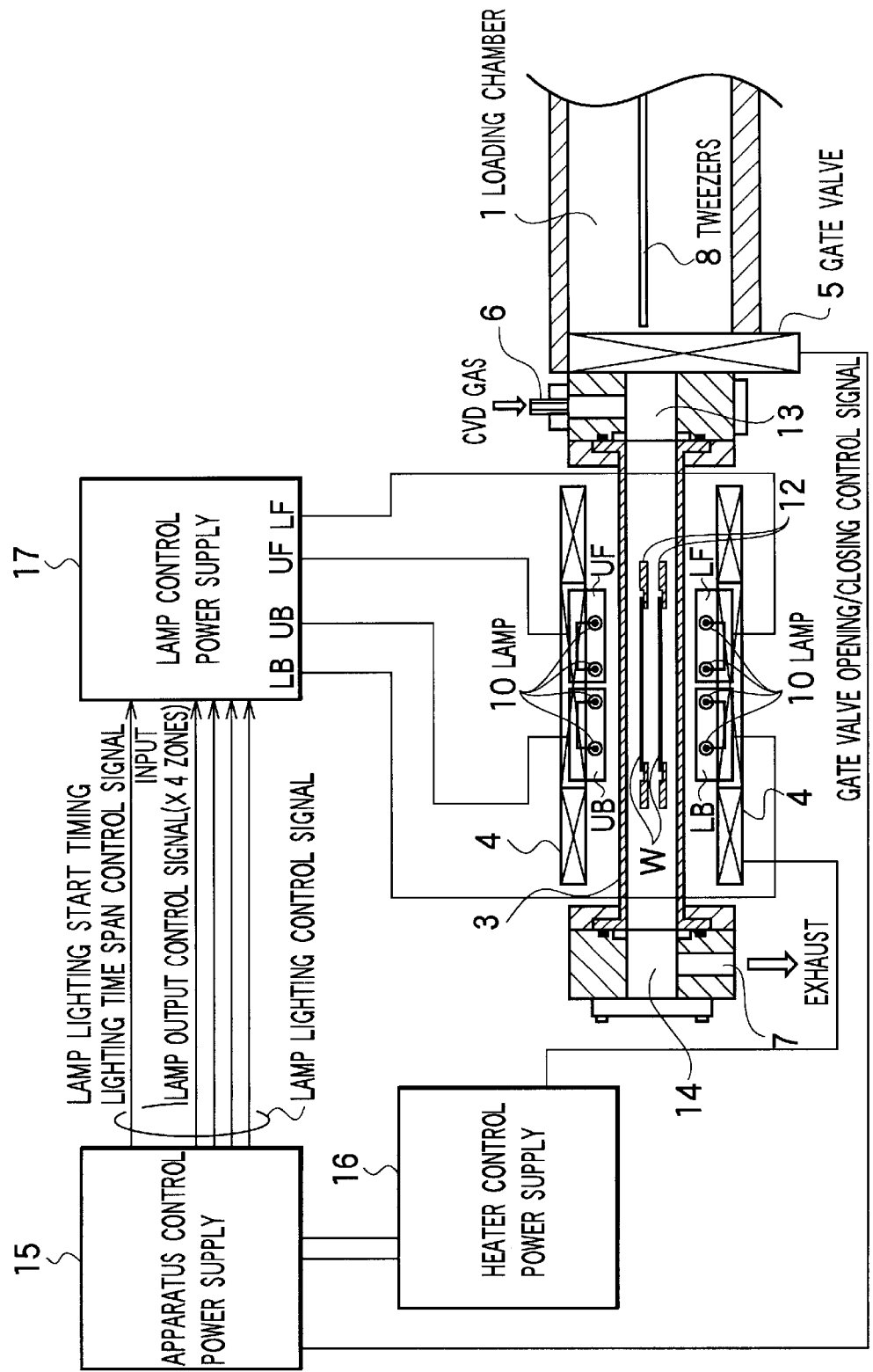
FIG. 1 is a schematic cross section of a rapid-heating, hot-wall CVD apparatus obtained by adopting the initial lamp heating technique according to a first embodiment.

FIG. 1 is a schematic cross section of a rapid-heating, hot-wall CVD apparatus. The CVD apparatus is provided with a quartz reactor furnace body 3 having a narrow space. The interior of the reactor furnace body 3 is provided with two sets of vertically spaced wafer susceptors 12 for supporting two wafers W stacked at an interval in the vertical direction perpendicular to the flat surfaces of the wafers, allowing wafers to be treated in dual substrate processing. In this arrangement, a flange 13 is provided to one end (right end) of the reactor furnace body 3, and CVD gas is introduced into the reactor furnace body 3 through a gas introduction port 6 connected to the flange 13. In addition, a flange 14 is provided to the other end (left end) of the reactor furnace body 3, and the gas is discharged through an exhaust port 7 connected to the flange 14. Although this is not shown in the drawing, another gas introduction port and another gas exhaust port are provided at positions facing the gas introduction port 6 and the gas exhaust port 7 across the wafers W, and these ports are switched during film formation to reverse the direction of gas flow. A plurality of split-type resistance heaters 4 are provided around the reactor furnace body 3, allowing the interior of the reactor furnace body 3 to be heated independently in each of the zones corresponding to the plurality of resistance heaters 4. A transfer chamber 1 for loading wafers W is provided in the vicinity of the hot-wall reactor furnace body 3. The transfer chamber 1 is connected to the flange 13 on one side of the reactor furnace body 3, and the connection can be opened and closed by a gate valve 5.

Lamps 10 are provided outside the quartz reactor furnace body 3 but inside the resistance heaters 4 for forming hot walls in order to directly lamp-heat the wafers W in the reactor furnace body 3 by light emission transmitted through the reactor furnace body 3 at the start of wafer heating. A plurality of lamps 10 are provided in the direction of wafer loading. The lamps 10 are arranged such that the illuminance distribution can be controlled to achieve uniform heating of the wafers W. Specifically, lamps 10 for forming a linear light source are shaped as rods, and a plurality of such rod-shaped lamps 10 are arranged parallel to the flat surfaces of horizontally held wafers but perpendicular to the direction of wafer loading.

The rod-shaped lamps 10 are positioned above and below the reactor furnace body 3 opposite the flat wafer surfaces in such a way that the upper lamps 10 face the upper wafer W and directly heat the flat surface of the upper wafer, and that the lower lamps 10 face the lower wafer W and directly heat the flat surface of the lower wafer. In addition, the distance between the upper lamps 10 and upper wafer W is set approximately equal to the distance between the lower lamps 10 and lower wafer W. Such an arrangement makes it possible to keep the temperature of the upper and lower wafers W uniform.

In the illustrated example, lamp heating is performed separately in the four zones UF, UB, LF, and LB, where F is defined as the area in front of the gate valve 5, B the area behind on the other side, U the upper area, and L the lower area, with the wafers W located in the middle. Two lamps 10 are connected in parallel in each zone, and the temperature distribution of lamp heating is thus rendered more uniform. Each zone is kept within an output range of 0 to 100% (0 to 2 kW).

Although the above description referred to an arrangement in which lamp heating was performed separately in four zones, it is apparent that a larger number of separate zones can be set up in order to provide a more flexible control procedure. Although the above description also referred to an arrangement in which two lamps per zone were connected in parallel, the temperature distribution immediately after lamp heating can be made even more uniform by connecting a larger number of lamps in parallel. It is also apparent that a single lamp per zone may be used.

An apparatus control power supply 15 is provided in order to operate the above-described rapid-heating, hot-wall CVD apparatus, and the gate valve 5 can be opened or closed by outputting gate valve opening/closing control signals from the apparatus control power supply 15. A heater control power supply 16 and a lamp control power supply 17 are connected as resistance heater controller and lamp controller, respectively, to the apparatus control power supply 15. The heater control power supply 16 independently controls the separate resistance heaters 4 in accordance with signals from the apparatus control power supply 15. In addition, the lamp control power supply 17 independently controls the lamps 10 of each zone.

By virtue of such independent control of the lamps 10, the temperature of the area closer to the gate valve 5 can be raised above the temperature of the area farther away from the gate valve 5 in order to compensate for the reduction in temperature near the gate valve due to the escape of heat through the gate valve during substrate loading, making it possible to compensate for an imbalance of the hot-wall system in a case involving, for example, area F near the gate valve of the lamps 10 and area B on the other side of the gate valve. There are also cases in which the temperature of the area farther away from the gate valve 5 can be made higher than the temperature of the area closer to the gate valve 5 in order to compensate for the imbalance in the film thickness distribution in the direction of gas flow. In such cases as well, any imbalance in the film thickness distribution can be compensated for by independent lamp control. In a case involving the area U of the upper lamps 10 and the area L of the lower lamps 10, the upper lamps 10 directly heat the obverse surface of the upper wafer, and the lower lamps 10 directly heat the reverse surface of the lower wafer. With silicon wafers, heat is absorbed at different rates on the front and back of the wafers W. The absorption rate is commonly higher on the back than on the front, so in such cases control is performed such that the temperature below is lower than the temperature above in order to establish uniform temperatures for the upper wafer and lower wafer. Actual wafer products may have various materials or patterns on their surfaces, so the absorption rates on the front and back of a wafer W are sometimes reversed. The lamps are individually controlled in accordance with these conditions in order to establish uniform temperatures for the upper wafer and lower wafer.

The lamp control power supply 17 is presented by the apparatus control power supply 15 with lamp lighting control signals composed of the three types of signals described below, making it possible to control the lamps 10 in each of the zones LB, UB, UF, and LF.

(1) A lamp lighting start timing signal designating the time elapsed between the moment the gate valve 5 is opened and the moment the lamps 10 are lighted.

(2) A lighting time span control signal designating the time the lamps 10 are to be lighted. (The relative heating quantity for each individual zone is controlled by the lamp output control signal described below, but the overall heating quantity is controlled by the length of the period determined on the basis of this lighting time span control signal.)

(3) A lamp output control signal for controlling the power supply output during lighting in each zone (multiplied by four zones).

Figure 2:
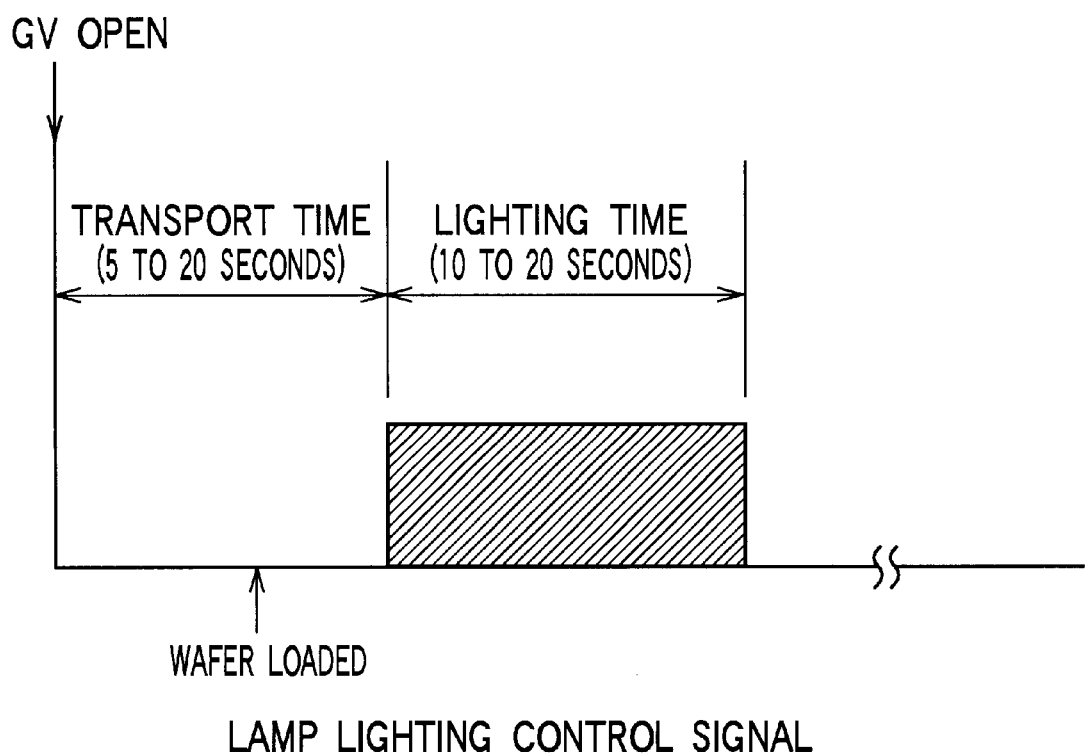
FIG. 2 is a diagram for the timing of lamp lighting in accordance with the first embodiment.

As shown in FIG. 2, a wafer W is transported from the transfer chamber 1 to the reactor furnace body 3 after the gate valve (GV) 5 is opened. The time elapsed until the valve is closed is commonly 5 to 20 seconds, and the time during which the lamps 10 remain lighted after the loading is completed is commonly 10 to 20 seconds. The rise of the lighting time (the hatched areas of the timing chart) is controlled by the aforementioned lamp lighting start timing signal, and the lamp lighting time is controlled by the aforementioned lighting time span control signal. The lamp lighting start timing sequence should be formed using the following signal as reference: a signal for opening the gate valve 5 during the loading of a wafer W into the reactor furnace body 3, a signal for loading the wafer from a substrate loading mechanism (not shown), or a signal based on the timing sequence immediately preceding the loading of the wafer W into the reactor furnace body 3.

Although the control system described above was based on an arrangement in which the output of each zone was a variable quantity, and the amount of heating applied to each zone was varied instead of keeping the lighting time constant for each zone, it is also possible to keep the output of each zone constant and to vary the lighting time of each zone separately from the above-described system.

Figure 3:
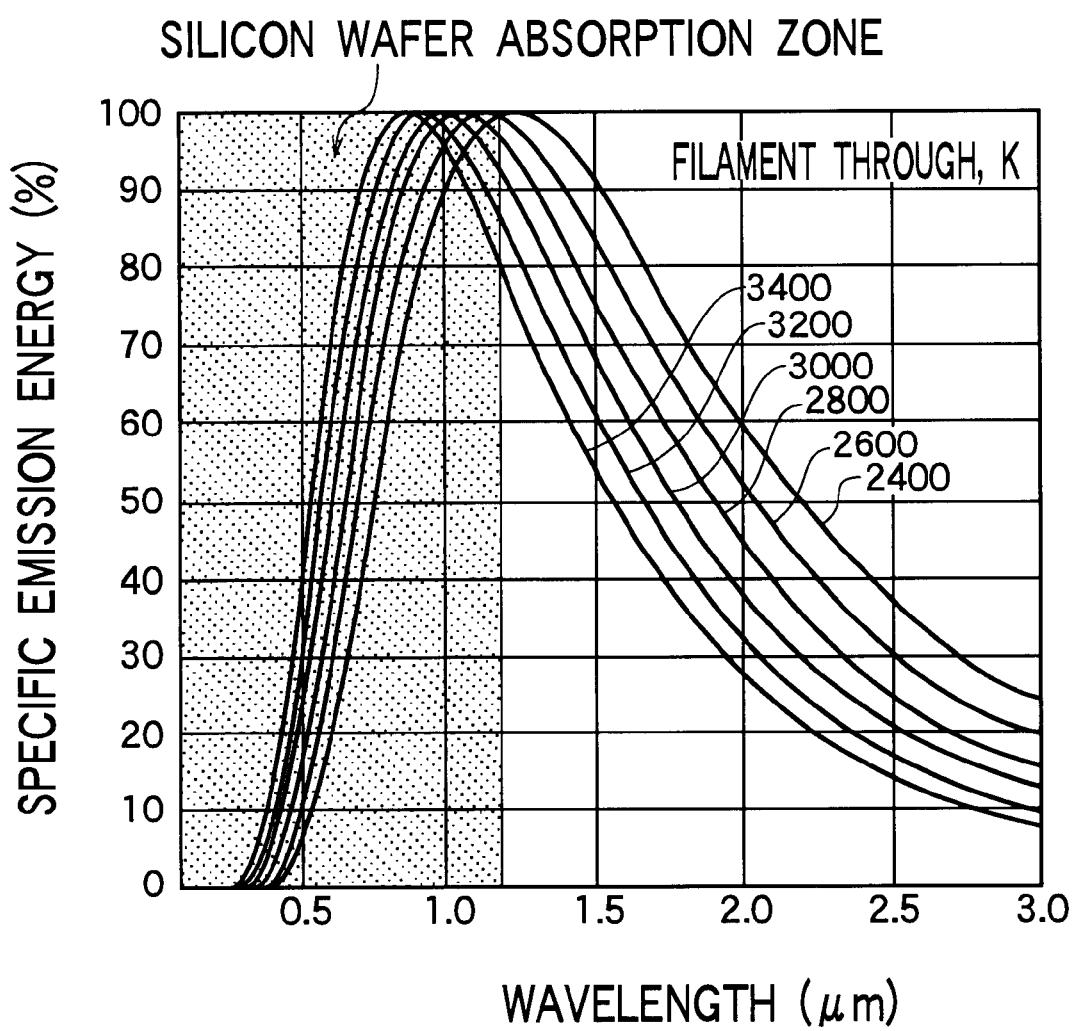
FIG. 3 in a diagram for showing an emission spectrum of a halogen lamp.
Figure 4:
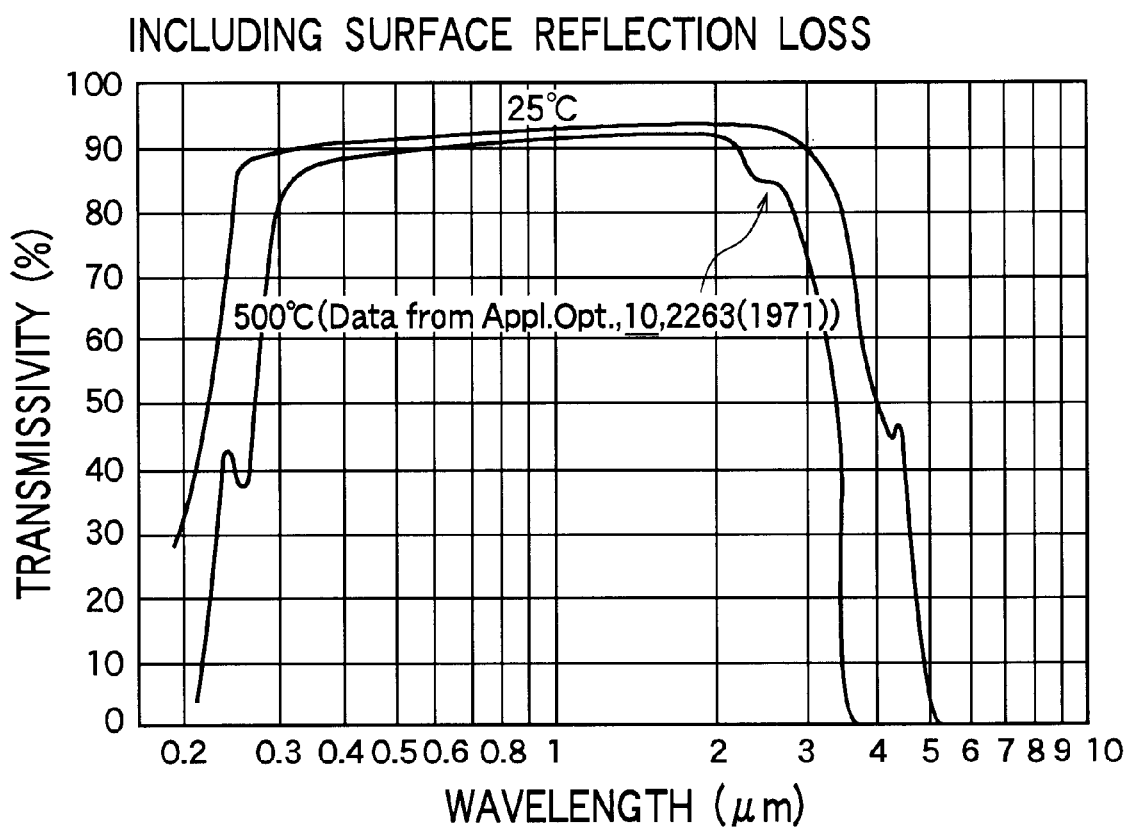
FIG. 4 is a diagram for showing a transmissivity of quartz (GE214 equivalent)

Halogen lamps are commonly used for lamp heating. FIG. 3 depicts an emission spectrum of a halogen lamp obtained by plotting the wavelength ($\mu$m) on the horizontal axis, and the specific emission energy (%) on the vertical axis. In addition, quartz is used for the reactor furnace body 3, and FIG. 4 depicts transmissivities of quartz heated to 25° C. and 500° C. Wavelength ($\mu$m) is plotted on the horizontal axis, and transmissivity (%) on the vertical axis. The quartz used is GE214 equivalent (manufactured by General Electronic). When these emmission spectrum and transmissivities are taken into account in conjunction with the absorption coefficients of the above-described silicon wafer, it can be seen that light emitted by the lamps 10 illuminates the wafers W with minimal absorption by the quartz, making it possible to selectively and rapidly heat solely the wafers W without disrupting the system as a hot wall.

In such a structure, the resistance heater 4 is energized by the heater control power supply 16 (which receives a control signal from the apparatus control power supply 15 prior to wafer loading), the temperature of the reactor furnace body 3 is set in advance to a prescribed level, and such energizing is continued past wafer loading to maintain the prescribed temperature. When wafers W are to be loaded, a gate valve opening/closing control signal is sent out, the gate valve 5 is opened, and two wafers W are supported by tweezers 8, loaded by a substrate loading mechanism (not shown) into the reactor furnace body 3 through the flange 13, and placed on two separate wafer susceptors 12.

Figure 5:
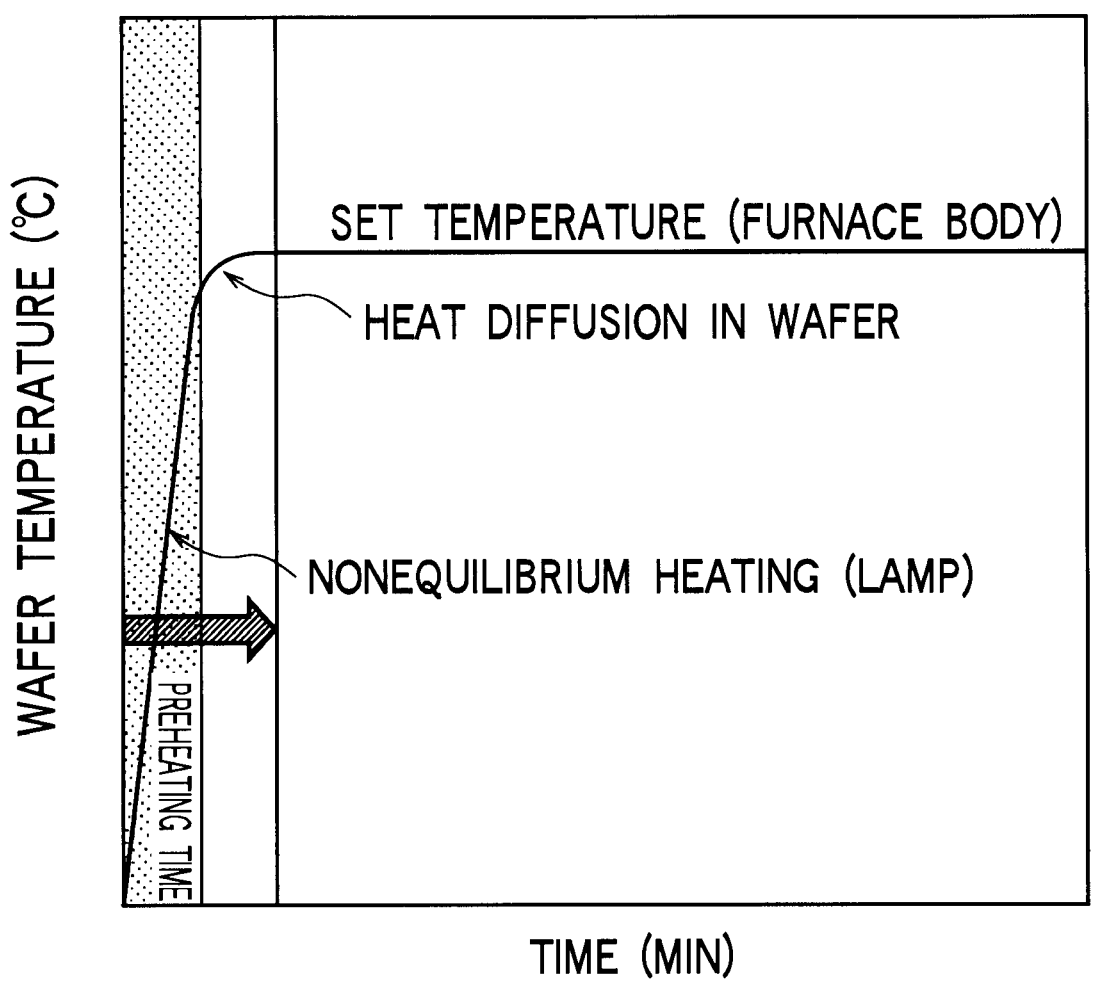
FIG. 5 is a diagram of the rise in the wafer temperature in accordance with the first embodiment.

With the lamp control power supply 17 receiving a lamp lighting control signal from the apparatus control power supply 15, the wafers W are loaded into the reactor furnace body 3 after the gate valve 5 has been opened, and prescribed lamp lighting start timing determined by the lamp lighting start timing signal is established, whereupon the lamps 10 are energized and lighted for a prescribed time (10 to 20 seconds) on the basis of a lighting time span control signal, and the wafers W are rapidly heated to a near-prescribed temperature. Once the average temperature of the wafers W has substantially reached the desired temperature, the supply of current to the lamps 10 is stopped, the lamps 10 are switched off, and a state in which the wafers in the hot-wall system have themselves achieved uniform heat transfer (heat has diffused throughout the wafers) is subsequently awaited. FIG. 5 depicts the manner in which the wafer temperature varies. The horizontal axis indicates time (min); the vertical axis, wafer temperature (° C.). The wafer temperature is rapidly raised by lamp heating, heat then diffuses throughout the wafers, and the temperature remains at the same level as that set for the reactor furnace body 3. The corresponding preheating time is very short because of the use of lamp heating. The temperature of the quartz reactor furnace body 3 starts to decrease the moment the wafers W are loaded, but because the wafer temperature can be raised to the furnace body temperature in a matter of several seconds to ten and several seconds, a considerable disturbance such as that encountered in the past is avoided.

More exactly, heating the quartz reactor furnace body 3 with the long-wavelength components (wavelength greater than about 3 $\mu$m) of lamp-emitted light makes it possible to compensate somewhat for the cooling of the quartz reactor furnace body 3 at the start of wafer heating or to raise the furnace body temperature to a certain extent. Consequently, presetting the temperature of the hot-wall system is indispensable for precise temperature control, taking into account that the temperature of the hot-wall system coincides with the desired average temperature of wafers W at the time the lamps 10 are switched off.

It is also preferable that lamp heating conditions be measured in advance in order to heat the wafers under the optimal lamp heating conditions suitable for rapid heating during actual substrate treatments. Specifically, temperature sensors(thermocouples or the like) detachable from the reactor furnace body are mounted in advance inside the reactor furnace body; and lamp output, lamp lighting time, and other lamp heating conditions are measured by this temperature sensor between the moment the substrates are loaded into the reactor furnace body and the lamps are lighted, and the moment the substrate temperature substantially reaches the prescribed temperature. With this arrangement, substrates can be heated under the optimal lamp heating conditions established by the aforementioned measurements, during an actual substrate treatment step (in which the temperature sensor have been dismantled and are not used any longer). Measurements involving the aforementioned lamp heating conditions will be described in detail below with reference to working examples.

Figure 6A:
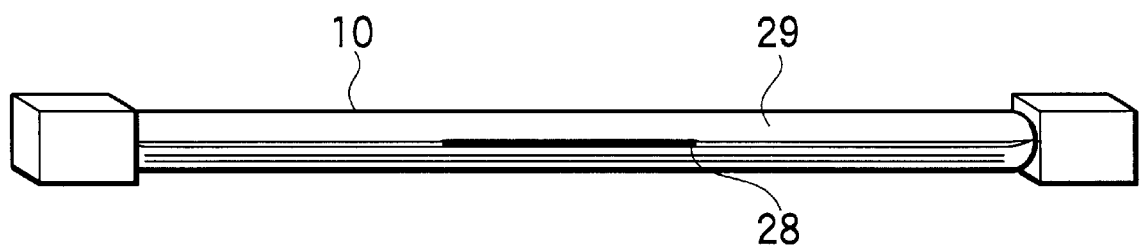
FIG. 6A and FIG. 6B are diagrams depicting a lamp used in the first embodiment, and an image of the radiation intensity distribution of light traveling from the lamps to a wafer.
Figure 6B:
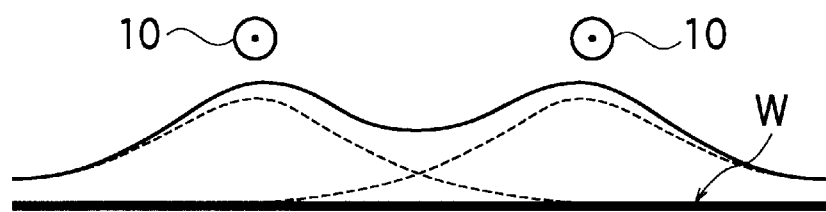

FIG. 6A and FIG. 6B depict a specific example of a lamp 10 used in this embodiment, and an image of the illuminance distribution of light impinging on the wafers W. As shown in FIG. 6A, half of the lamp is used for heating by an exposed filament 28, and the other half is covered with a reflecting material 29. Two lamps 10 are placed close together as shown in FIG. 6B, and the radiance distributions of the two lamps are mutually complemented and averaged. The preheating time is the sum of the time needed to raise the means temperature of the wafer W to the desired level, and the time needed to subsequently establish uniform heat transfer in the wafer itself. It is apparent that achieving a more uniform temperature distribution in the wafer heated to the desired temperature reduces the time needed to achieve uniform heat transfer after that, resulting in a proportionally shorter preheating time. Consequently, even simple lamp heating should preferably entail selecting lamp structures, arrangements, and other parameters by taking into account the need for an illuminance distribution capable of yielding a higher degree of uniformity. It is thus apparent that although only two lamps are shown in FIG. 6A and FIG. 6B, a greater number of lamps may be used where cost is not a concern, and the wafer temperature can be rendered more uniform at the start of heating.

After the temperature inside the wafers has been rendered uniform, the reaction gas introduced into the reactor furnace body 3 through the gas introduction port 6 is decomposed, and the reaction product is deposited on the wafer surface, yielding thin films. The gas used in the reaction is discharged through the exhaust port 7. The treated wafers W covered with thin films are transported into the transfer chamber 1 through the flange 13 and the gate valve 5 while supported by the tweezers 8.

Second Embodiment

Figure 7:
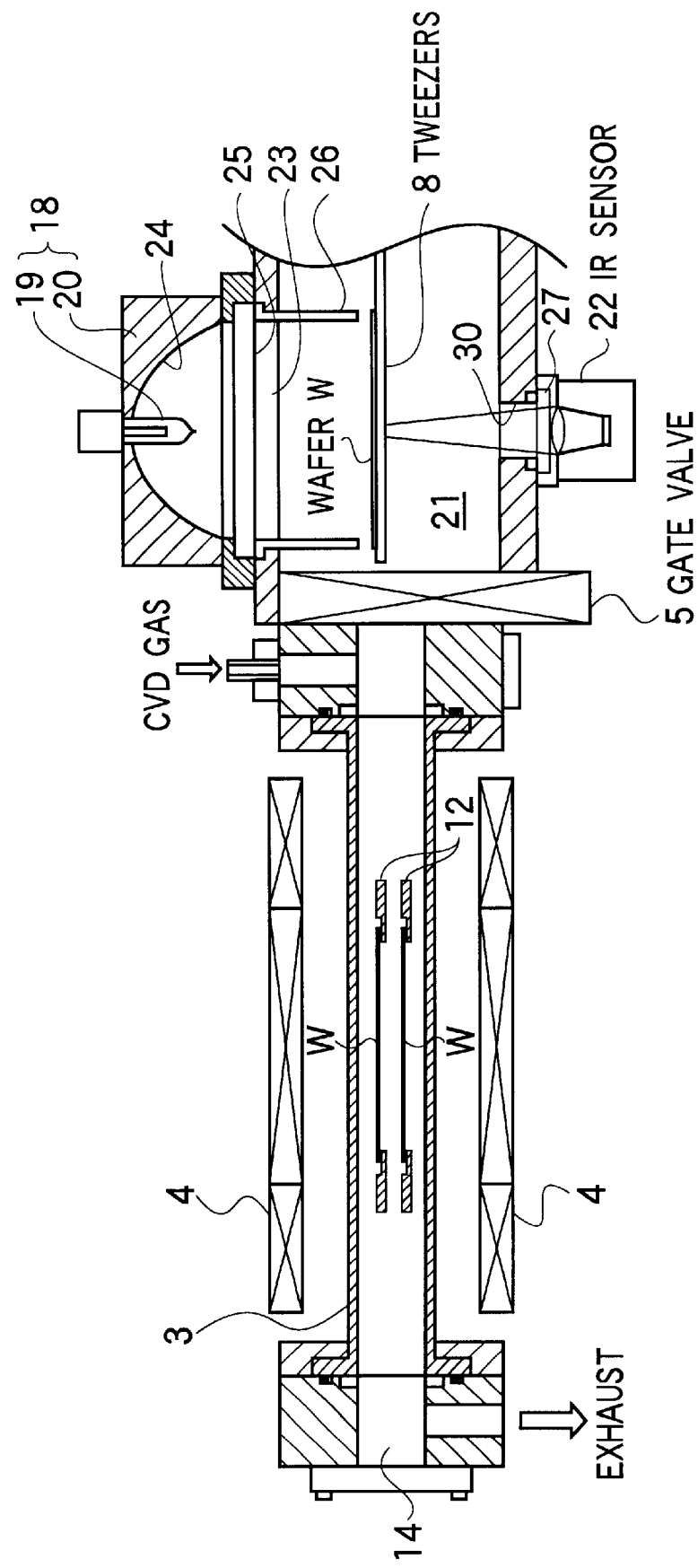
FIG. 7 is a schematic cross section of a rapid-heating, hot-wall CVD apparatus obtained by adopting the outside preheating technique according to a second embodiment.

FIG. 7 is a schematic cross section of a rapid-heating, hot-wall CVD apparatus in which a transfer chamber 21 adjacent to the reactor furnace body 3 is provided with a preheating mechanism 18 for preheating wafers W before they are loaded into the reactor furnace body 3. The difference from the first embodiment is that the lamps are removed from the reactor furnace body 3, the transfer chamber 21 is provided with a preheating mechanism 18, and a temperature sensor 22 is provided for measuring the wafer temperature. Although the preheating mechanism 18 may be a resistance heater, a lamp 19 is used herein to achieve rapid heating.

The area above the preheating position of the transfer chamber 21 for preheating wafers W supported by tweezers 8 is provided with a lamp opening 23 whose diameter is substantially the same as that of a wafer W, and a lamp 19 is mounted as a point light source in the lamp opening 23 opposite the wafer W and perpendicular to the flat surface thereof. The lamp 19 is mounted using a fixture 20 having a parabolic reflecting surface 24 on the inner surface thereof. The reason that the lamp 19 is shaped as a point light source is that this arrangement provides the simplest and least expensive structure, with fewer limitations pertaining to the mounting or temperature conditions than in the case of the reactor furnace body 3. The lamp opening 23 is closed by a fitted glass window 25. An annular reflecting plate 26 enclosing the wafer W is suspended from the top portion of the transfer chamber to allow light emitted by the lamp 19 to reach the wafer surface and to preheat it with high efficiency.

A sensor opening 30 narrower than the lamp opening 23 is provided below the preheating position of the transfer chamber 21, and a temperature sensor 22 capable of measuring the wafer temperature in real time is mounted in this sensor opening 30. The temperature sensor 22 should preferably be an infrared temperature sensor (IR sensor) for monitoring infrared light emitted by the reverse surface of the wafer and measuring the temperature on the basis of the intensity of this light. Unlike the lamp opening 23, the sensor opening 30 is closed with a fitted window 27 made of $CaF_2$, $BaF_2$, or another material with high infrared transmissivity. Other materials may also be selected with consideration for their cost and transmitted wavelengths.

In this system, the wafer W is heated in the transfer chamber 21, but the temperature of the wafer W decreases during the transport of the wafer to the reactor furnace body 3, making it necessary to heat the wafer in such a way that excessive heating is performed in order to compensate for the temperature reduction in advance. Because emissivity varies with the type of wafer W, it is impossible to unconditionally determine the degree to which such excessive heating should be performed. Assuming, however, that the desired wafer temperature is 500° C. (that is, the temperature must be 500° C. when the wafer is loaded into the furnace body) and that the time needed to transport the wafer from the preheating position is 5 seconds, a temperature of 600 to 650° C. must be achieved as a result of such heating.

The temperature of the wafer W not yet loaded into the reactor furnace body can be controlled by measuring the wafer temperature in real time with the aid of an IR sensor. The purposes of this is not only to control the preheating temperature of the wafer during each treatment cycle, but also to determine the cooling rate of the wafer by measuring the temperature changes of the heated wafer W left in the heated state without being transported. It is therefore possible to deduce the appropriate preheating temperature on the basis of the wafer cooling rate even for varying wafer W types.

Figure 8:
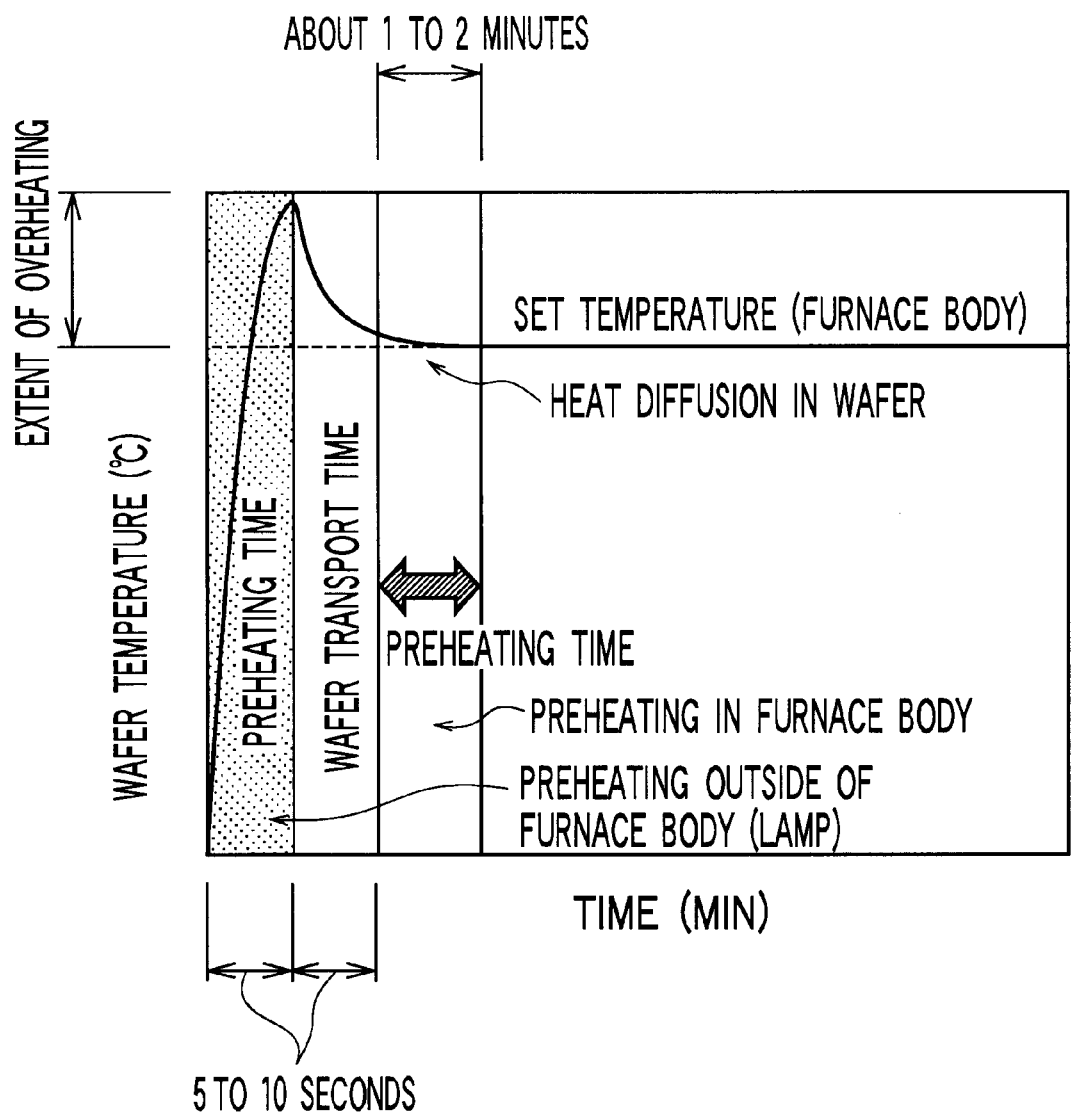
FIG. 8 is a diagram of the rise in the wafer temperature in accordance with the second embodiment.

As shown in FIG. 8, the time needed for the wafer temperature to achieve a set level in accordance with the second embodiment includes the outside preheating time (5 to 10 seconds) needed to preheat the wafer to an excess, the wafer transport time (5 to 10 seconds), and the inside preheating time (about 1 to 2 minutes) needed for the set temperature to settle as a result of heat diffusion in the wafer. In this case, better results are obtained with shorter inside preheating times. Measuring the cooling rate of the wafer temperature with the aid of an IR sensor prior to treatment makes it possible to calculate backward the temperature to which the wafer has cooled between the time preheating is completed and the time the wafer W is loaded into the reactor furnace body 3, so the wafer W should be preheated to a temperature that exceeds the corresponding temperature. There are, however, cases in which there is a limit above which heating is not allowed for certain types of wafers W under existing device characteristics, and preheating to the aforementioned excessive temperatures is not necessarily possible. Even in such cases, preheating a wafer W to the allowed temperature reduces the effect of the temperature reduction brought about by the introduction of the wafer into the reactor furnace body 3 in comparison with conventional cases in which no preheating is performed, resulting in a higher throughput due to accelerated heating and in less film thickness nonuniformity among wafers due to a continuous wafer treatment.

In the reactor furnace body 3, two wafers W are treated at the same time, so these two wafers must be simultaneously heated during the preheating step. In view of this, two preheating positions are established in the transfer chamber 21, and a preheating mechanism 18 is mounted at each location to allow two wafers to be simultaneously heated.

Figure 9:
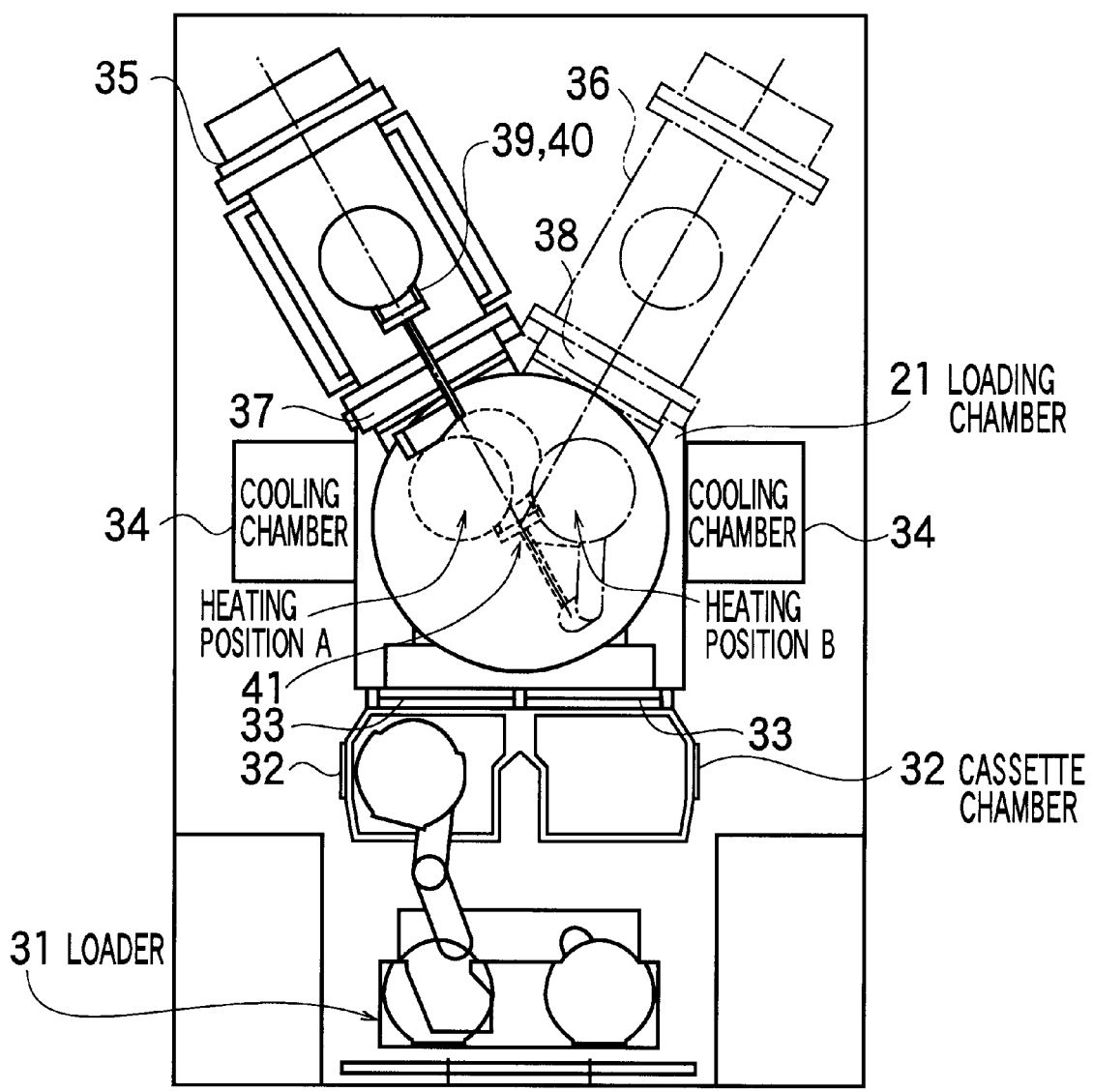
FIG. 9 is a plan view of the structure of a CVD apparatus equipped with two preheating mechanisms.
Figure 10:
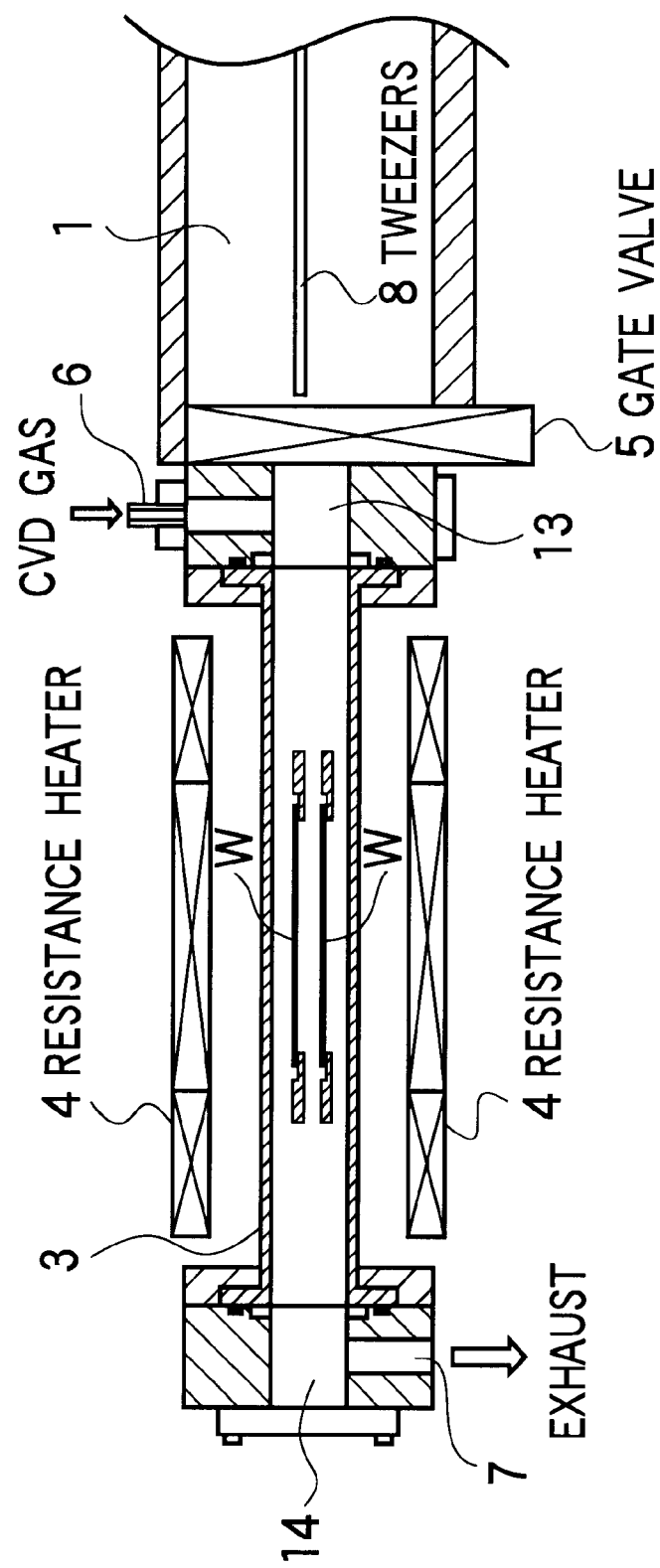
FIG. 10 is a schematic cross section of a hot-wall CVD apparatus according to a conventional example.
Figure 11:
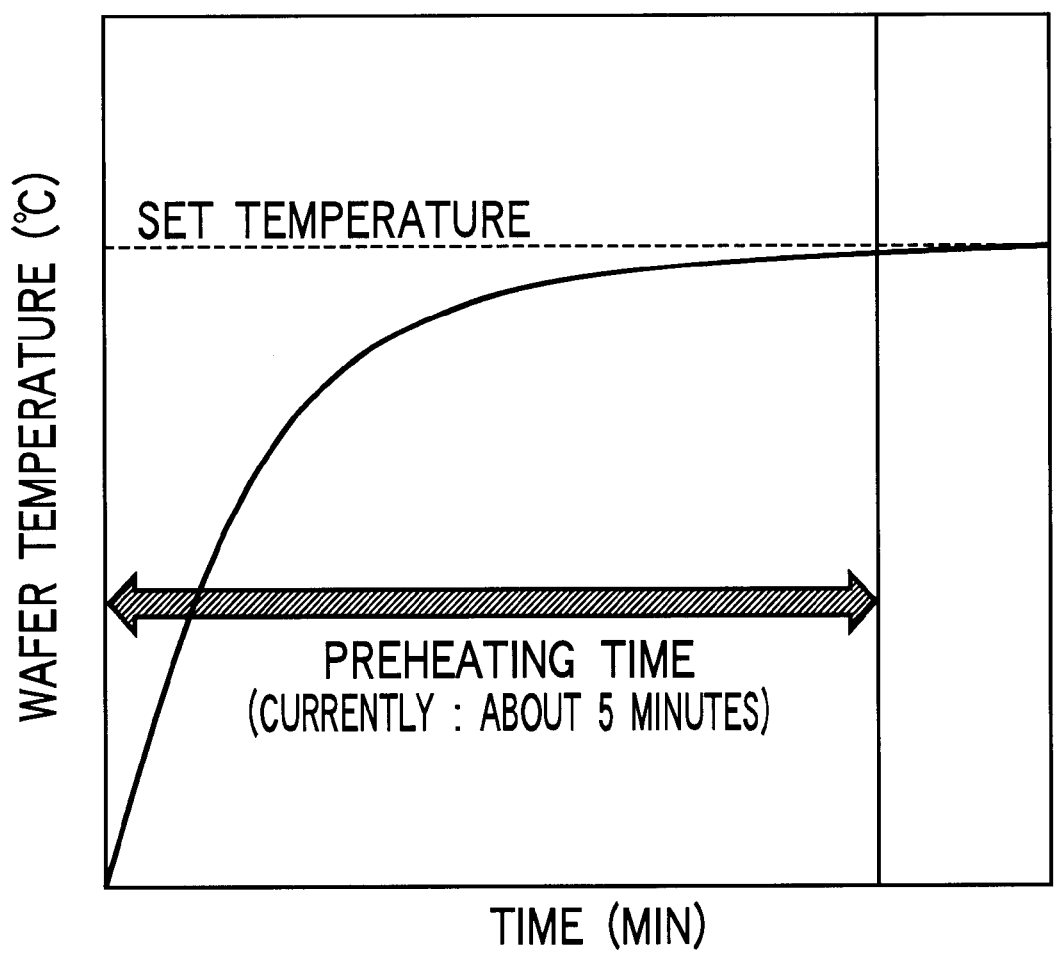
FIG. 11 is a diagram of the rise in the wafer temperature according to a conventional example.
Figure 12:
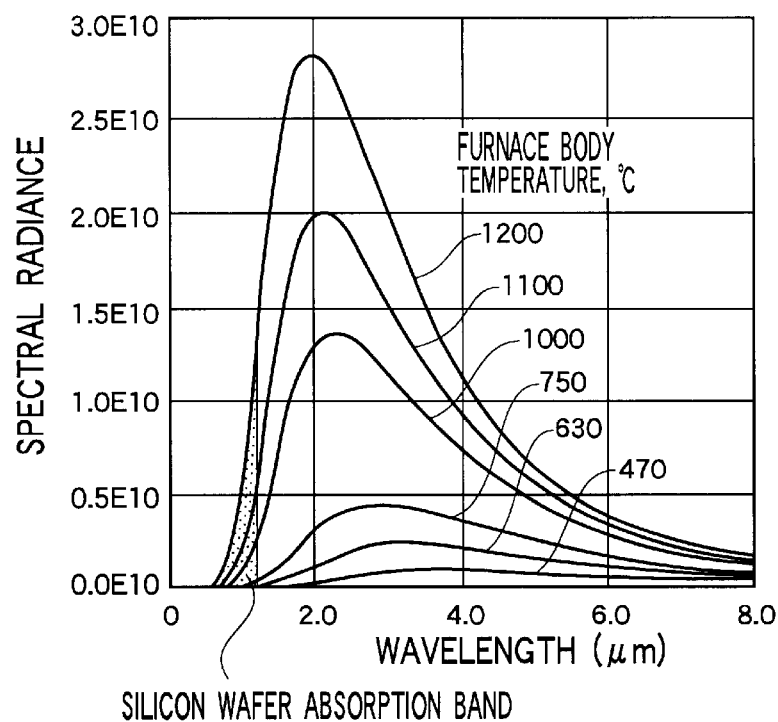
FIG. 12 is a characteristic diagram of a blackbody radiation wavelength distribution.
Figure 13:
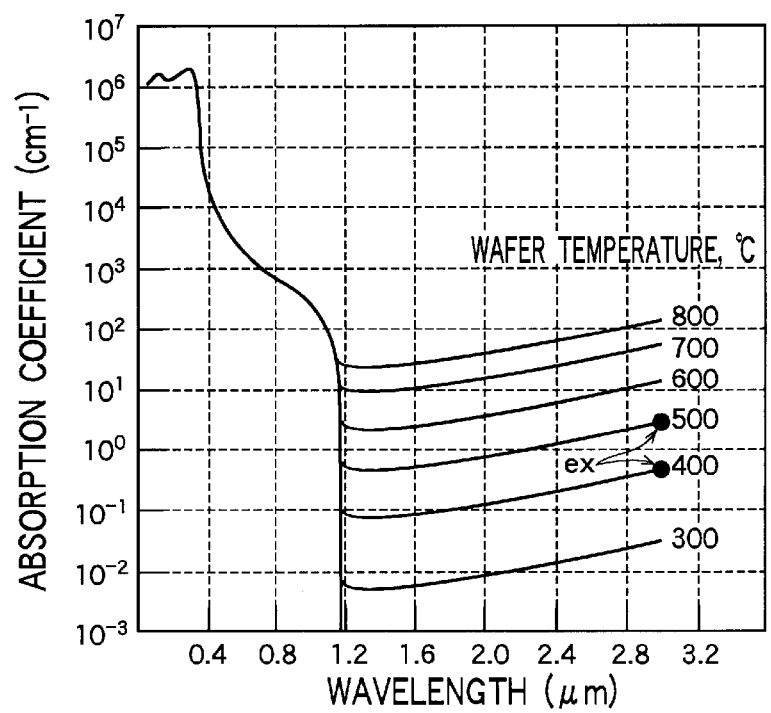
FIG. 13 is a diagram for showing an absorption coefficient of a silicon wafer.
Figure 14:
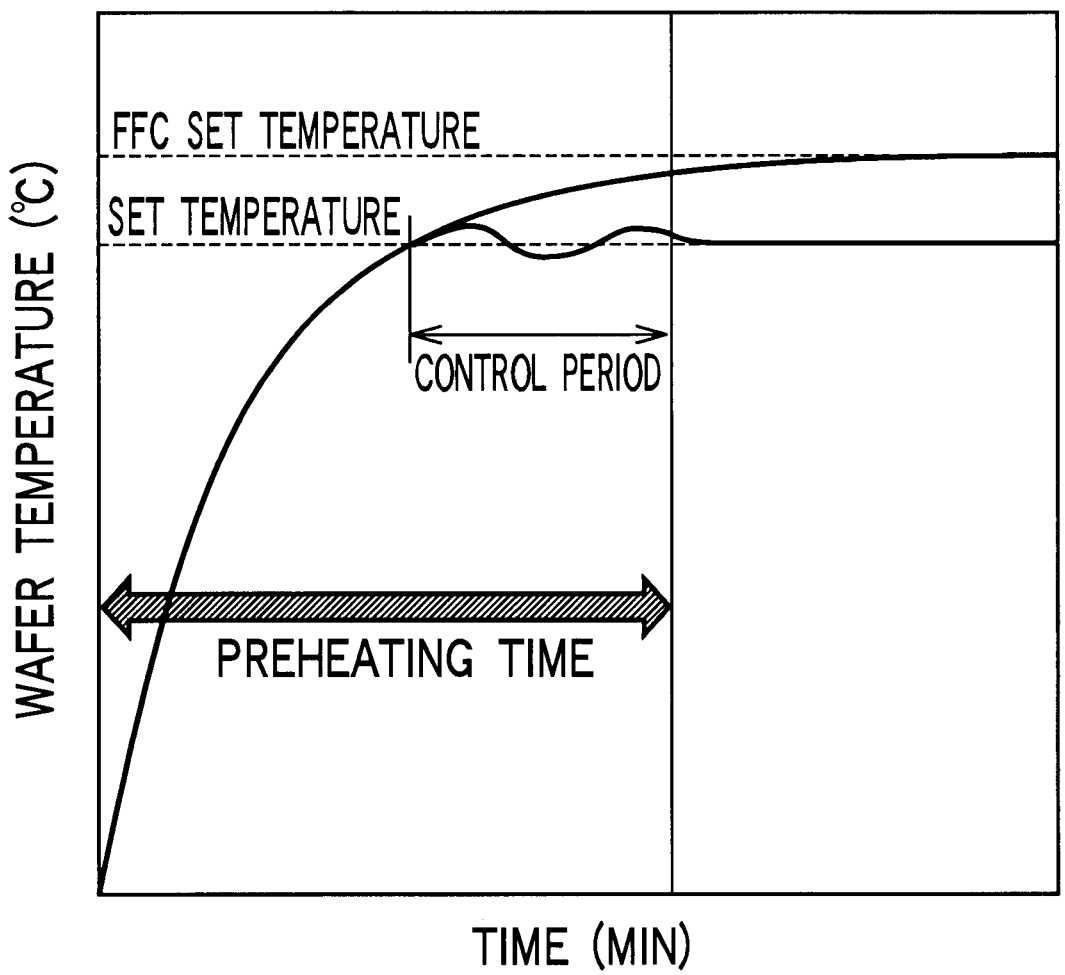
FIG. 14 is a diagram of the rise in the wafer temperature where an FFC control method is adopted for a hot-wall CVD apparatus in accordance with a conventional example.
Figure 15:
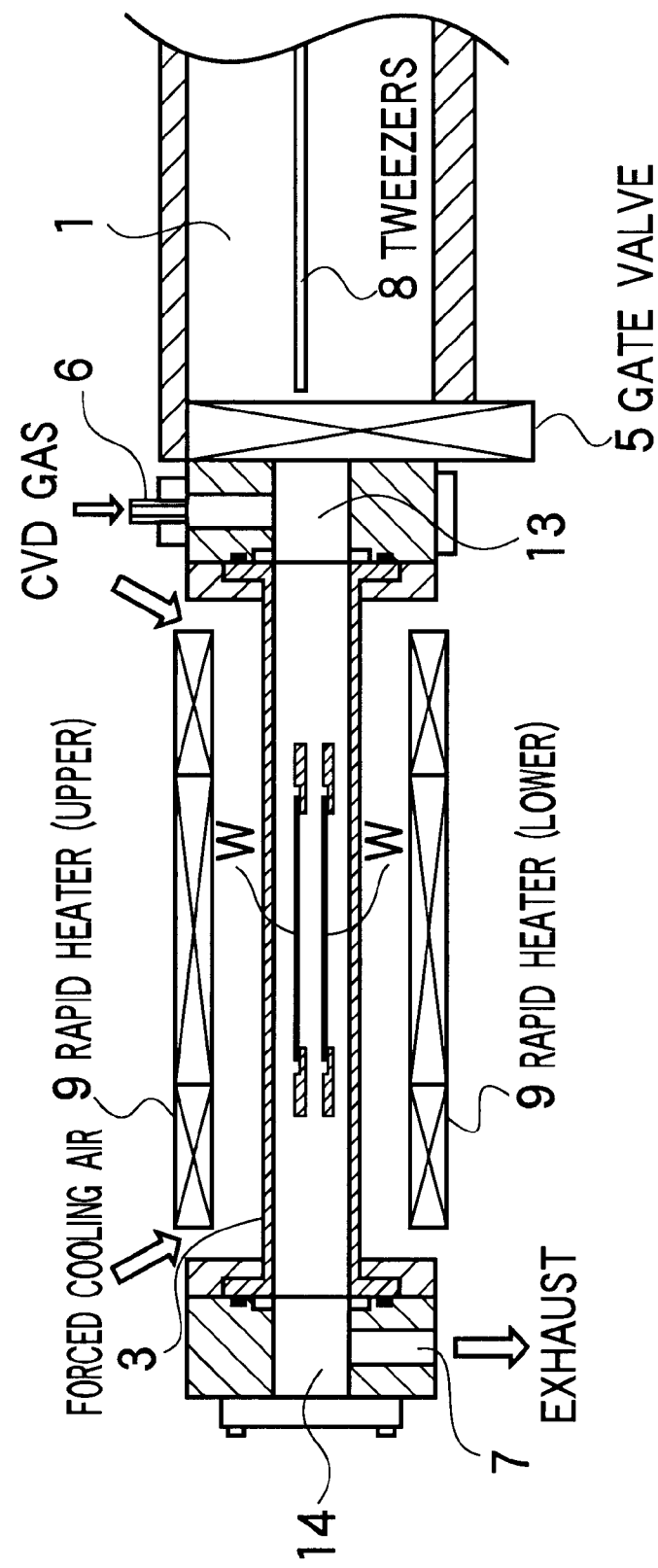
FIG. 15 is a schematic cross section of a hot-wall CVD apparatus obtained by adopting a rapid heating technique in accordance with a conventional example.
Figure 16:
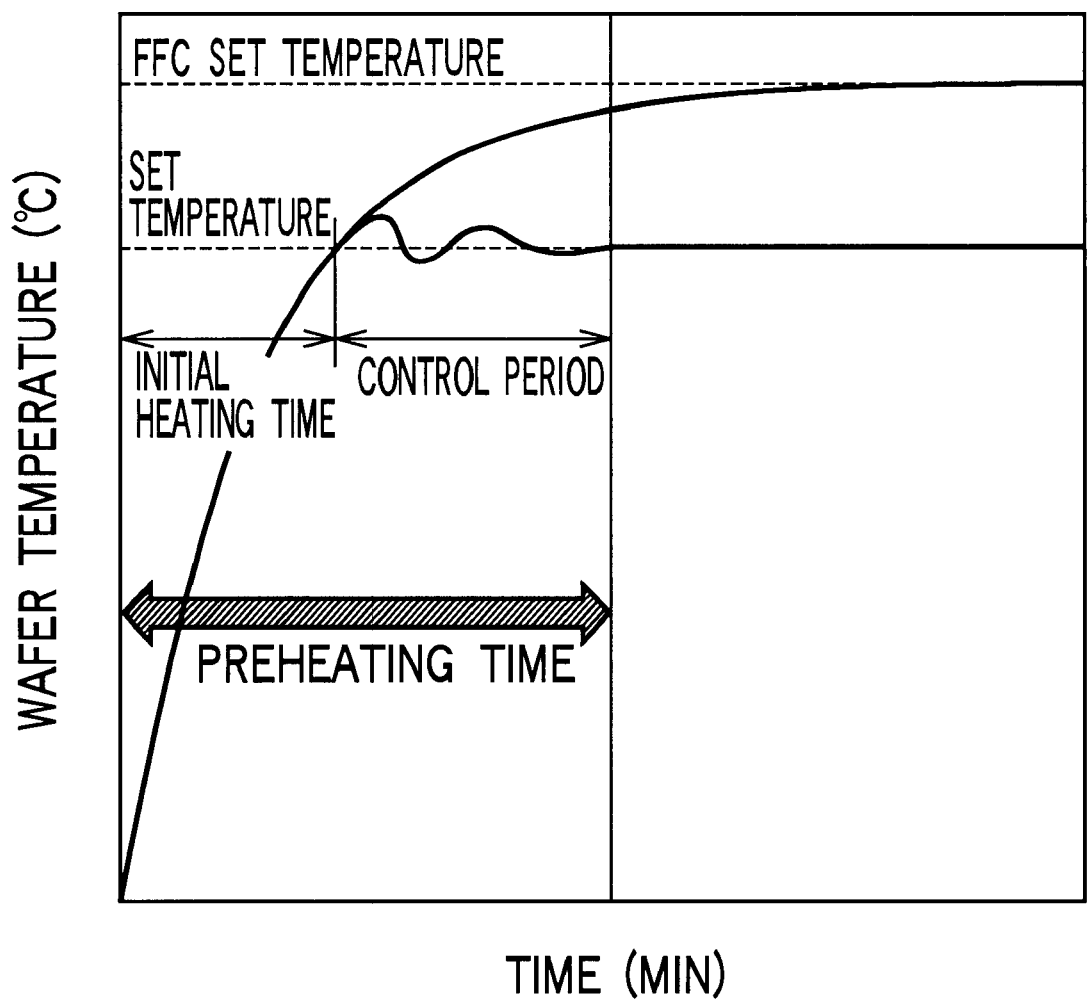
FIG. 16 is a diagram of the rise in the wafer temperature of a hot-wall CVD apparatus obtained by adopting the rapid heating technique.

FIG. 9 is a diagram illustrating a CVD apparatus equipped with such preheating mechanisms at two locations. In the central transfer chamber 21, two adjacent cassette chambers 32 are provided on the side of a loader 31 through the agency of gate valves 33, and two cooling chambers 34 are provided at opposite positions. In addition, a first reactor furnace 35 and a second reactor furnace 36 are provided between the two cooling chambers 34 through the agency of gate valves 37 and 38. The transfer chamber 21 is provided with a substrate transfer 41 having two pairs of tweezers 39 and 40 capable of independently transporting wafers W one by one (it is apparent that two wafers can also be transported at the same time). As shown in the drawing, two preheating positions A and B are provided in a parallel planar configuration, and the above-described preheating mechanisms (not shown) are disposed at these positions to allow two wafers to be preheated at the same time. These preheating mechanisms allow each wafer to be preheated separately under the desired heating conditions by taking into account the differences in travel time due to fact that the distance between the preheating position A and the reactor furnace is different from the distance between the preheating position B and the reactor furnace during the simultaneous transport of two wafers W to the reactor furnace, and by taking into account the travel times from each preheating position to the corresponding reactor furnace 35 or 36 when the wafers W are transported to a plurality of reactor furnaces 35 and 36. This can be achieved by controlling the wafer temperature with the aid of the above-described IR sensor.

Compared with the first embodiment described above, the second embodiment is disadvantageous in the sense that more-complicated preheating mechanisms or the like must be further installed, and an additional time is expended to perform heating prior to wafer transport. The first embodiment is limited, however, to applications involving the CVD apparatus for handling the types of film through which lamp light can transmit, whereas the second embodiment is considered to represent a technique that is applicable to a CVD apparatus capable of handling any type of film and that, in principle, has the least thermal effect on the reactor furnace body and is the best option in terms of utilizing the distinctive features of the hot-wall principle.

Although the embodiments were described with reference to a CVD apparatus, the present invention is not limited to a CVD apparatus and may, for example, be adapted to a diffusion apparatus or the like.

WORKING EXAMPLES

A working example of the first embodiment will now be described with reference to FIG. 17A and FIG. 17B. The heat treatment apparatus used is a hot-wall system in which resistance heaters 4 are provided outside a reactor furnace body 3, and this reactor furnace body 3 is heated. Also provided on the outside of the reactor furnace body 3 and lamps 10 for directly heating wafers W by emitted light that passes through the reactor furnace body 3. A plurality of separately energized and controlled lamps 10 are provided in order to allow the wafers W to be divided among a plurality of zones and to independently heated each zone. The following four zones are established in the illustrated example: upper zone UF on the side of the gate valve, upper zone UB on the opposite side from the gate valve, lower zone LF on the side of the gate valve, and lower zone LB on the opposite side from the gate valve. The resistance heaters 4 are energized to keep the temperature of the reactor furnace body 3 and the temperature inside the reactor furnace body 3 at a prescribed level prior to wafer loading, and this energizing is continued after the wafers have been loaded. After the wafers are loaded, the lamps 10 are energized, the wafers W are heated to a near-prescribed temperature, and the lamps are switched off following heating. After the lamps have been switched off, the wafer temperature is rendered uniform by the temperature of the hot-wall system.

Here, the process time needed to heat a wafer to 470° C. and to form a film was evaluated by being compared with conventional practice when a $Ta_2O_5$ film was deposited under standard conditions (wafer temperature: 470° C.; film thickness uniformity: within ±3%) using the above-described heat treatment apparatus. The wafer temperature of 470° C. is cited as an example, and the present invention can be used to deposit CVD films within a temperature range of 300 to 700° C.

In this evaluation, it was very difficult to measure the wafer temperature directly, and ti was impossible to use conventional methods in which the wafer temperature is measured in a steady state (for example, a method in which measurements are made using thermocouples directly bonded to wafers W), particularly in observing the transient temperature variations accompanying wafer loading and unloading. In view of this, tubular quartz components (hereinafter referred to as "profile TCs") 11 provided with a plurality of thermocouples were introduced between the upper and lower wafers W, measurements were performed at five points (four points on the four sides of a wafer and one point in the center of the wafer), and wafer temperature behavior was indirectly estimated, as shown in FIG. 17A and FIG. 17B.

Figure 18:
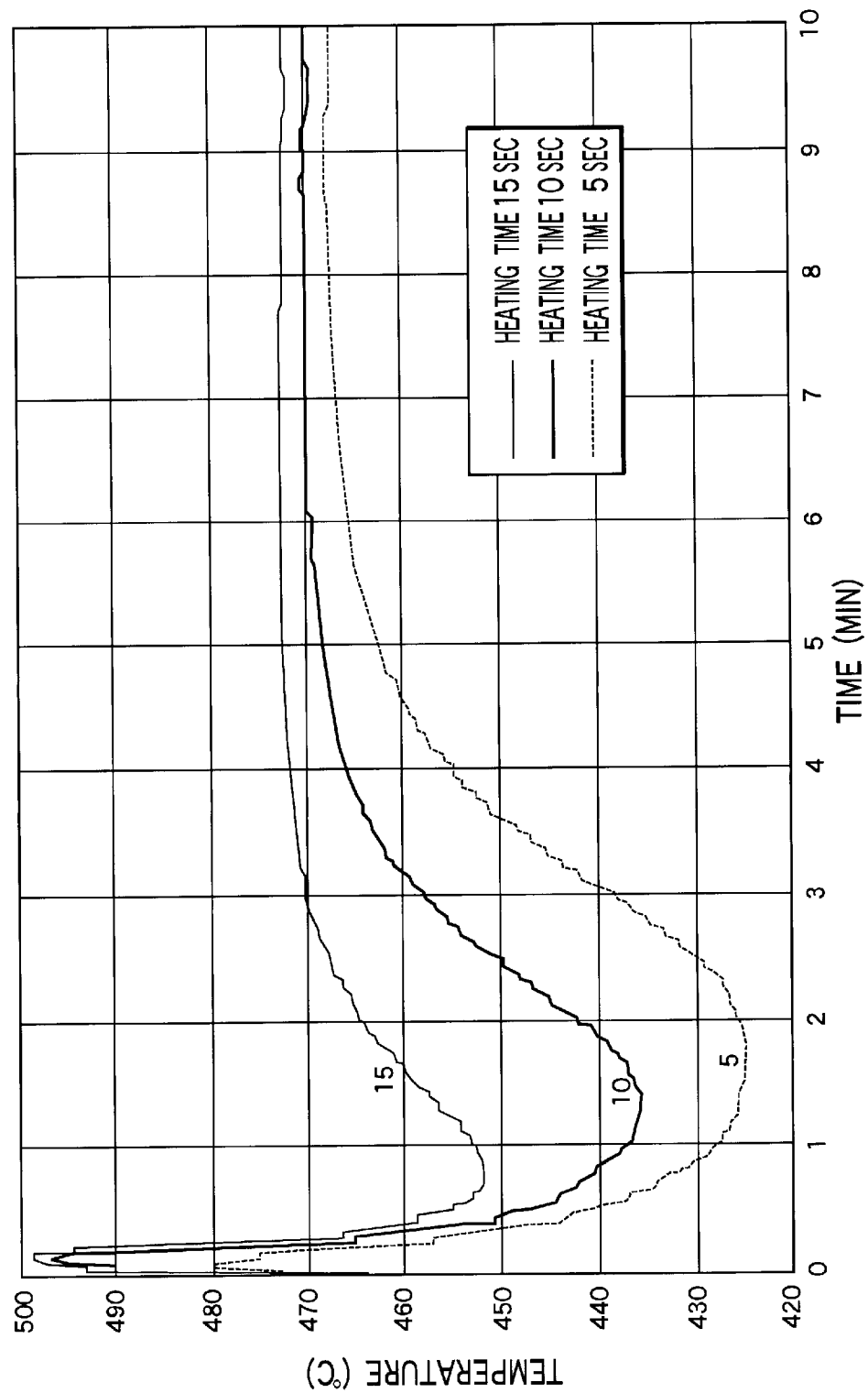
FIG. 18 is a characteristic diagram of changes in the temperature of a profile TC (at the central position of a wafer) under variable lamp heating time.

FIG. 18 depicts results obtained when the lamp output of all zones was first fixed at 85%, the time elapsed between the opening of the gate valve and the lighting of the lamps was fixed at 15 seconds, and the temperature of the above-described profile TCs (in the center of the wafer) was monitored while the heating time was alternated among 5, 10, and 15 seconds in order to determine the optimum amount of heating provided by the lamps. In this case, it was estimated that because the profile TC had a heat capacity of it own (primarily accounted for by the tubular quartz), there was a considerable time delay with respect to the actual wafer temperature, so the quantity of heating that provided the best approximation of the furnace body temperature (470° C.) prior to wafer loading in a step approaching a steady state was termed optimum quantity of heating. Based on the results depicted in the drawing, it was concluded that the heating was insufficient at 5 seconds, was excessive at 15 seconds, and ranged from substantially optimum to slightly insufficient at 10 seconds, so the quantity of heating achieved at a lamp output of 85% and a heating time of 11 seconds was tentatively defined as optimum quantity of heating.

Figure 19:
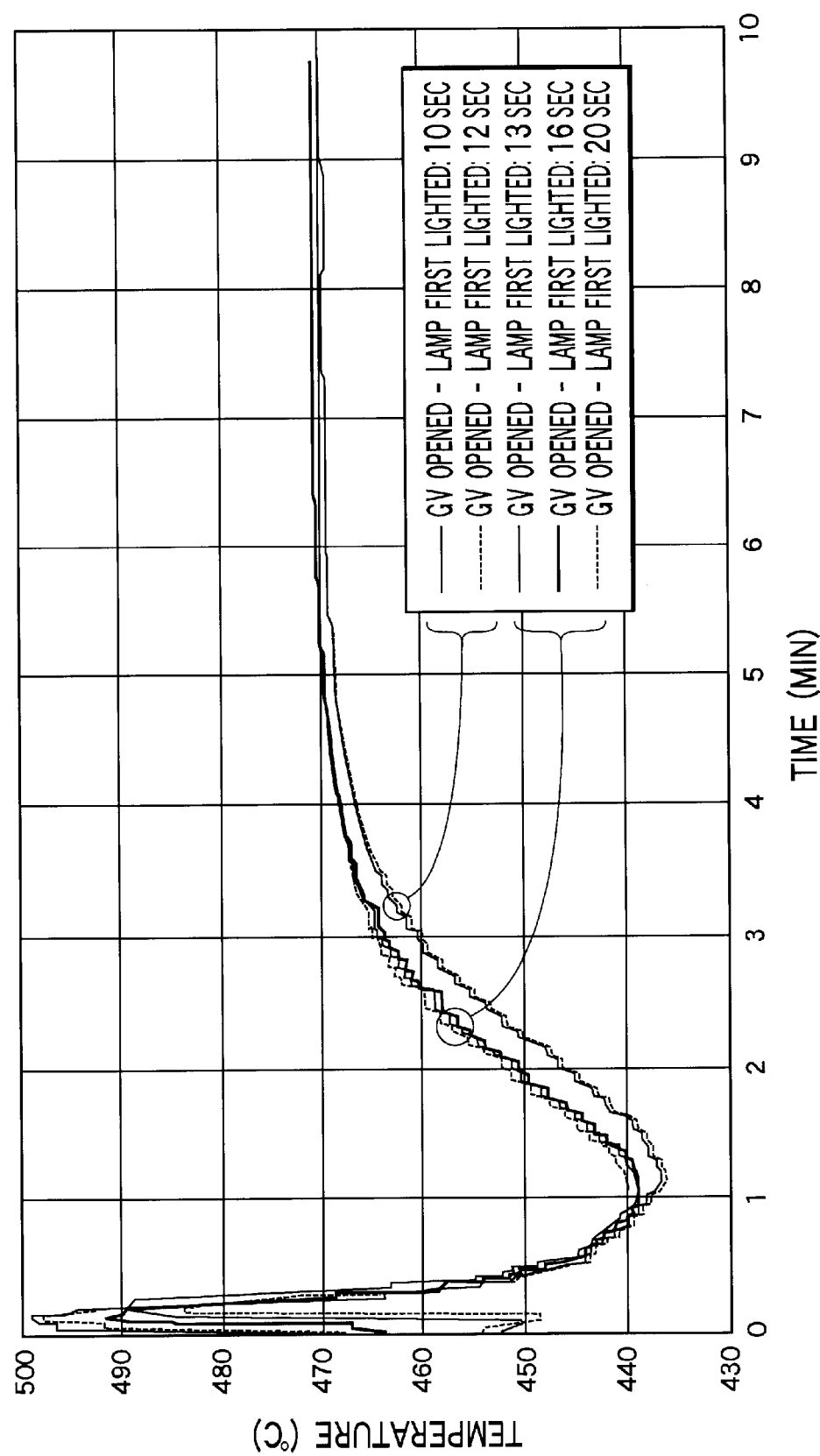
FIG. 19 is a characteristic diagram of changes in the temperature of a profile TC (at the central position of a wafer) under variable lamp lighting start time.

FIG. 19 depicts results obtained when the temperature of the above-described profile TC (at the central position of a wafer) was monitored while the time elapsed between the opening of the gate valve and the lighting of the lamps was varied under conditions in which the lamp output for the optimum quantity of heating obtained above was fixed at 85%, and the heating time was fixed at 11 seconds. The results in the drawing demonstrate that virtually no changes occur between 13 and 20 seconds, making it possible to confirm that a certain margin can be secured even with some temporal variations. As a result, the time elapsed between the opening of the gate valve and the start of lamp lighting in the subsequently performed experiments was set to 15 seconds.

Figure 20:
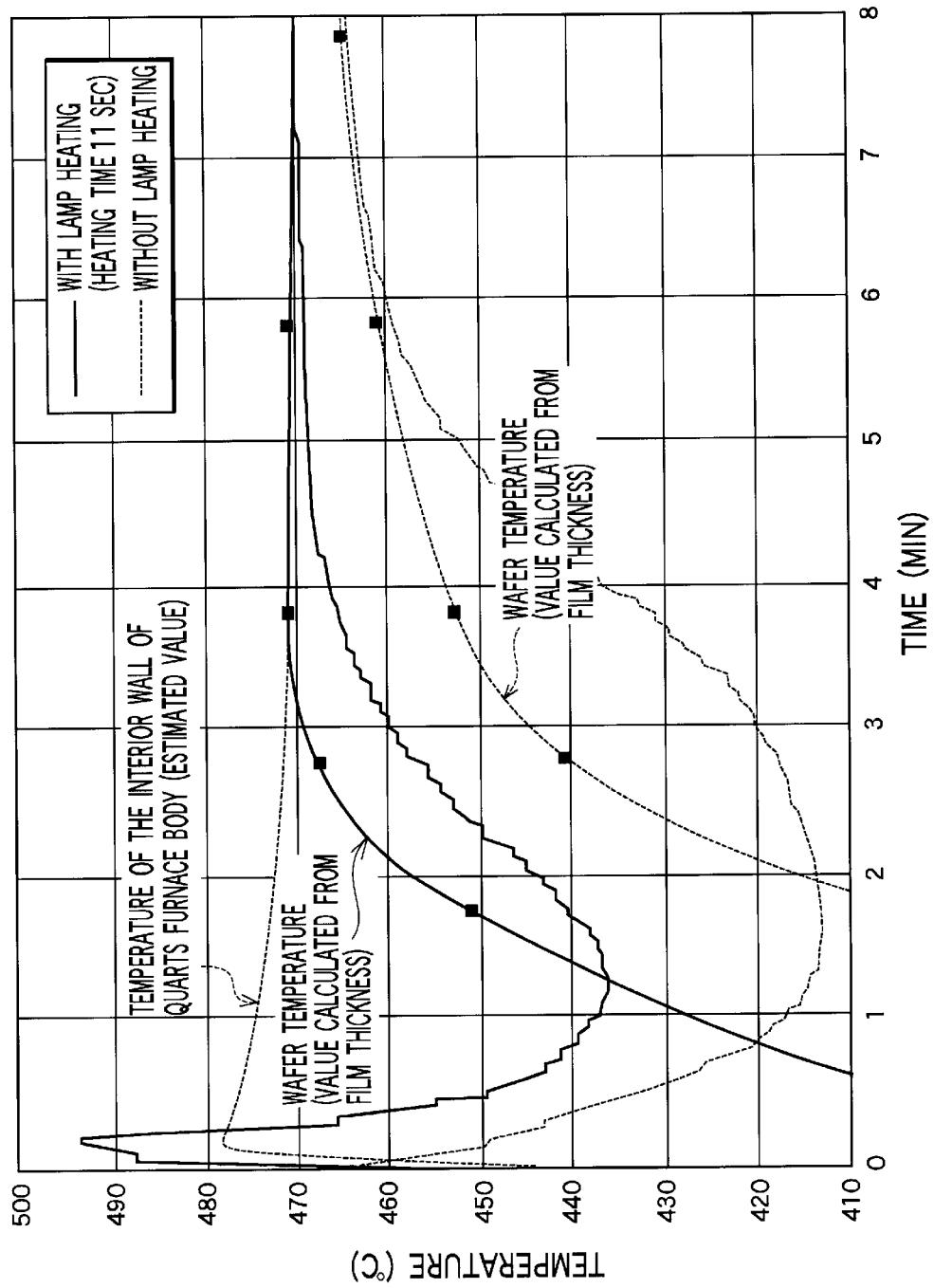
FIG. 20 is a characteristic diagram of temporal changes in wafer temperature derived from the film deposition temperature and the profile TC temperature (at the central position of a wafer) in the presence and absence of lamp heating.

FIG. 20 shows a comparison between an arrangement with no lamp heating (conventional heating method) and an arrangement (present working example) in which lamp heating was performed under the lamp heating conditions established in the above-described experiments (lamp output: lamp rating 2 kW per zone·85% output×4 zones; time elapsed between the opening of the gate valve and the start of lamp lighting: 15 seconds; lamp lighting time: 11 seconds). In addition, changes in the temperature of the profile TCs lagged behind the changes in the actual wafer temperature (as described above), so films were deposited under the above-described actual heating conditions, and the wafer temperature was plotted be performing back calculations with the aid of the Arrhenius equation on the basis of the film formation rate of film thickness. The unmarked curve in the drawing shows the results of monitoring the temperature of the above-described profile TC (at the central position of a wafer) during the heating of the wafers under the above-described heating conditions. In addition, "the temperature of the interior surfaces of the quartz furnace body" in the drawing refers to the estimated value of the temperature of the interior surfaces of a quartz reactor furnace body during the heating of wafers under the above-described heating conditions. This value expresses the manner in which the quartz reactor furnace body is heated, albeit slightly, by lamps during lamp heating. The drawing demonstrates that while the conventional method is such that the hot-wall furnace body fails to achieve 470° C. in 8 minutes due to the loading of wafers, using lamp heating brings the temperature to within 470° C.±1° C. in about 3 minutes. It can also be seen that whereas conventional film deposition is started after about 5 minutes of heating, the heating time can be reduced to about 2 minutes when the films are deposited at substantially the same temperature. This suggests that combining lamps with a hot-wall system and performing heating in accordance with the present embodiment reduces the heating time and markedly improves throughput.

Figure 21:
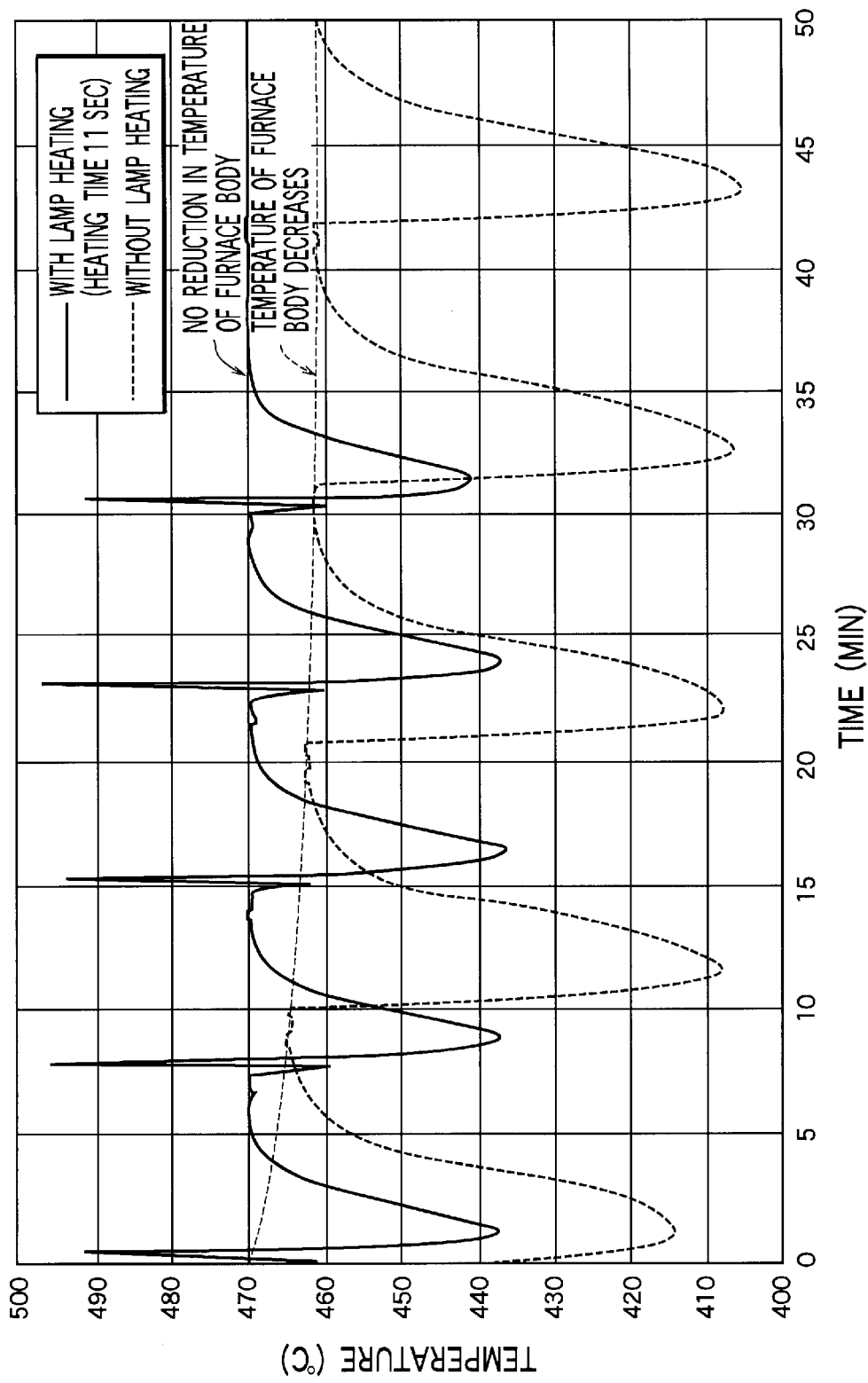
FIG. 21 is a characteristic diagram of changes in the temperature of a profile TC (at the central position of a wafer) for a continuous five-cycle wafer treatment.

FIG. 21 depicts changes in the temperature of a profile TC (at the central position of a wafer) obtained when wafers were continuously treated five times. It can be seen that while the conventional example with no lamp heating is such that the temperature of the reactor furnace body 3 decreases when wafers W are continuously treated, the combined lamp heating system in accordance with the present embodiment not only improves throughput but also prevents the temperature of the reactor furnace body 3 from being lowered by wafer loading when the wafers W are continuously treated, and allows the temperature of the furnace body to remain stable on a consistent basis. This has the ultimate effect of reducing the film thickness nonuniformity of continuously treated wafer lots.

The present invention allows the unacceptably long substrate heating time required by hot-wall heat treatment apparatus to be dramatically reduced while preserving the advantage of being able to establish a uniform substrate temperature with considerable ease, making it possible to improve equipment throughput and process productivity.

What is claimed is:

1. A heat treatment method, wherein a hot-wall heat treatment apparatus in which the temperature inside a reactor furnace body is kept at a prescribed level with the aid of resistance heaters prior to substrate loading into the reactor furnace body is provided with lamps disposed outside said reactor furnace body and designed to heat substrates loaded into the reactor furnace body by light emission transmitted through the reactor furnace body, said method comprising:

a first step in which the substrates are loaded into the reactor furnace body kept at said prescribed temperature, and said substrates are then directly heated to a desired temperature by the lamps provided outside said reactor furnace body under continued heating by said resistance heaters; and a second step in which said first step is completed, said lamps are then switched off, and a heat treatment is performed on said substrates with use of the heating by said resistance heaters.

2. A heat treatment method as defined in claim 1, said second step being characterized by being set such that said lamps are switched off, a prescribed time period then elapses, and said heat treatment is performed on said substrates.

3. A heat treatment method as defined in claim 1, said heat treatment method comprising presetting the temperature inside the reactor furnace body before the lamps are lighted to a level different from a desired heat treatment temperature in such a way that the temperature inside the reactor furnace body coincides with the desired heat treatment temperature when the lamps are switched off after the substrates have been heated to substantially the desired temperature by said lamps.

4. A treat treatment method as defined in claim 1, said heat treatment method comprising:

measuring in advance the lamp output, lamp lighting time, and other lamp heating conditions needed for the substrate temperature to substantially achieve the desired temperature after the substrates have been loaded into the reactor furnace body and the lamps lighted; and heating the substrates in the actual substrate treatment step under the lamp heating conditions obtained as a result of said measurements.

5. A hot-wall heat treatment apparatus for heating the interior of a reactor furnace body with the aid of resistance heaters provided outside the reactor furnace body, said heat treatment apparatus comprising:

lamps provided outside said reactor furnace body and designed to heat substrates inside said reactor furnace body by light emission transmitted through the reactor furnace body;

resistance heater controller that energizes said resistance heaters prior to substrate loading into the reactor furnace body, keeps the temperature inside the reactor furnace body at a prescribed level, and maintains said energized state after the substrate have been loaded into the reactor furnace body; and lamp controller that lights said lamps after said substrates have been loaded into the reactor furnace body, heats said substrates to a desired temperature, and switches off said lamps following heating, such that a heat treatment is performed on said substrates with use of the heating by said resistance heaters.

6. A heat treatment apparatus as defined in claim 5, said heat treatment apparatus comprising performing a treatment while supporting the flat surfaces of the substrates substantially parallel to the direction of substrate transport inside the reactor furnace body.

7. A heat treatment apparatus as defined in claim 6, said heat treatment apparatus comprising treating a single substrate or two substrates stacked in the vertical direction perpendicular to the flat surfaces of the substrates.

8. A heat treatment apparatus as defined in claim 6, said heat treatment apparatus comprising disposing said lamps opposite the flat surfaces of the substrates.

9. A heat treatment apparatus as defined in claim 7 for treating two substrates, said heat treatment apparatus comprising an arrangement in which said lamps are provided at an upper position and a lower position, the flat surface of the upper substrate is directly heated by placing the upper lamps opposite the flat surface of the upper substrate, and the flat surface of the lower substrate is directly heated by placing the lower lamps opposite the flat surface of the lower substrate.

10. A heat treatment apparatus as defined in claim 9, said heat treatment apparatus comprising substantially equalizing the distance between the upper lamps and the upper substrate with the distance between the lower lamps and the lower substrate.

11. A heat treatment apparatus as defined in claim 5, said heat treatment apparatus comprising a plurality of said lamps arranged in the direction of substrate transport.

12. A heat treatment apparatus as defined in claim 11, said heat treatment apparatus comprising using as said lamps rod-shaped lamps disposed perpendicular to the direction of substrate transport.

13. A heat treatment apparatus as defined in claim 9, said heat treatment apparatus allowing lamp output to be independently controlled.

14. A heat treatment apparatus as defined in claim 5, said heat treatment apparatus comprising presetting the temperature inside the reactor furnace body before the lamps are lighted to a level different from a desired heat treatment temperature in such a way that the temperature inside the reactor furnace body coincides with the desired heat treatment temperature when the lamps are switched off.

15. A heat treatment apparatus as defined in claim 5, said heat treatment apparatus comprising:
   providing the reactor furnace body with detachable temperature sensor that measures the temperature in the vicinity of the substrates inside the reactor furnace body;
   using the temperature sensor disposed inside the reactor furnace body to measure in advance the lamp output, lamp lighting time, and other lamp heating conditions needed for the substrate temperature to substantially achieve the desired temperature after the substrates have been loaded into the reactor furnace body and the lamps lighted; and
   heating the substrates under the lamp heating conditions obtained through said measurements in an actual substrate treatment step devoid of said temperature sensor.

16. A hot-wall heat treatment apparatus for heating the interior of a reactor furnace body with the aid of resistance heaters provided outside the reactor furnace body, and heat treatment apparatus comprising:
   lamps provided outside said reactor furnace body and designed to heat substrates inside said reactor furnace body by light emission transmitted through the reactor furnace body;
   resistance heater control means for energizing said resistance heaters prior to substrate loading into the reactor furnace body, keeping the temperature inside the reactor furnace body at a prescribed level, and maintaining said energized state after the substrate have been loaded into the reactor furnace body; and
   lamp control means for lighting said lamps after said substrates have been loaded into the reactor furnace body, heating said substrates to a desired temperature, and switching off said lamps following heating, such that a heat treatment is performed on said substrates with use of the heating by said resistance heaters.

* * * * *

UNITED STATES PATENT AND TRADEMARK OFFICE
CERTIFICATE OF CORRECTION

PATENT NO.    : 6,414,280 B1           Page 1 of 1
DATED         : July 2, 2002
INVENTOR(S)   : Eisuke Nishitani, Katsuhisa Kasanami, Naoko Matsuyama and Shinya Sasaki It is certified that error appears in the above-identified patent and that said Letters Patent is hereby corrected as shown below:

Column 24,
Line 11, reads: "heaters provided outside the reactor furnace body, and"
should read -- heaters provided outside the reactor furnace body, said --

Signed and Sealed this

Fifth Day of November, 2002

*Attest:*

*Attesting Officer*

JAMES E. ROGAN
*Director of the United States Patent and Trademark Office*